US012488962B2

(12) United States Patent
Hara et al.

(10) Patent No.: US 12,488,962 B2
(45) Date of Patent: Dec. 2, 2025

(54) SUBSTRATE PROCESSING APPARATUS, PLASMA GENERATING APPARATUS, AND METHOD OF MANUFACTURING SEMICONDUCTOR DEVICE

(71) Applicant: Kokusai Electric Corporation, Tokyo (JP)

(72) Inventors: Daisuke Hara, Toyama (JP); Tatsuya Nishino, Toyama (JP); Tsuyoshi Takeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 385 days.

(21) Appl. No.: 18/083,060

(22) Filed: Dec. 16, 2022

(65) Prior Publication Data

US 2023/0207261 A1 Jun. 29, 2023

(30) Foreign Application Priority Data

Dec. 28, 2021 (JP) ................................. 2021-215043

(51) Int. Cl.
*H01J 37/32* (2006.01)

(52) U.S. Cl.
CPC .. *H01J 37/32091* (2013.01); *H01J 37/32568* (2013.01); *H01J 37/32577* (2013.01); *H01J 37/32715* (2013.01)

(58) Field of Classification Search
CPC ........... H01J 37/33091; H01J 37/32568; H01J 37/32577; H01J 37/32715
See application file for complete search history.

(56) References Cited

U.S. PATENT DOCUMENTS

| | | | | |
|---|---|---|---|---|
| 2007/0152470 | A1 | 7/2007 | Salz | |
| 2009/0137128 | A1* | 5/2009 | Ko | H01J 37/32009 156/345.43 |
| 2017/0268105 | A1* | 9/2017 | Takeda | C23C 16/401 |
| 2019/0206705 | A1* | 7/2019 | Takeda | H01L 21/67098 |

FOREIGN PATENT DOCUMENTS

| | | | |
|---|---|---|---|
| JP | 2006-332498 | A | 12/2006 |
| JP | 2007-063640 | A | 3/2007 |
| JP | 2007-182221 | A | 7/2007 |
| JP | 2007-324477 | A | 12/2007 |
| JP | 2017-168788 | A | 9/2017 |
| JP | 2020-521270 | A | 7/2020 |
| WO | 2018/055700 | A1 | 3/2018 |
| WO | 2018/200409 | A1 | 11/2018 |

OTHER PUBLICATIONS

Taiwan Office Action issued on Aug. 9, 2023 for Taiwan Patent Application No. 111139944.
Japanese Office Action issued on Sep. 26, 2023 for Japanese Patent Application No. 2021-215043.

* cited by examiner

*Primary Examiner* — Alexander H Taningco
*Assistant Examiner* — Pedro C Fernandez
(74) *Attorney, Agent, or Firm* — Volpe Koenig

(57) ABSTRACT

There is provided a technique that includes: a process chamber in which a substrate is processed; a plurality of first electrodes; a plurality of second electrodes; a high-frequency power supply configured to supply a high-frequency power; a high-frequency power application plate configured to connect the plurality of first electrodes to the high-frequency power supply; and a grounding plate configured to ground the plurality of second electrodes.

19 Claims, 19 Drawing Sheets

SUBSTRATE PROCESSING APPARATUS, PLASMA GENERATING APPARATUS, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2021-215043, filed on Dec. 28, 2021, the entire contents of which are incorporated herein by reference.

TECHNICAL FIELD

The present disclosure relates to a substrate processing apparatus, a plasma generating apparatus, and a method of manufacturing a semiconductor device.

BACKGROUND OF THE INVENTION

As a process of manufacturing a semiconductor device, substrate processing of forming or removing various films such as an insulating film, a semiconductor film, a conductor film, and the like on a substrate by loading the substrate into a process chamber of a substrate processing apparatus and supplying a precursor gas and a reaction gas into the process chamber may be carried out.

In mass production apparatuses in which fine patterns are formed, a temperature may be lowered to suppress diffusion of impurities or enable the use of materials with low heat resistance such as organic materials.

Such a low temperature may be commonly achieved by performing substrate processing by using plasma, but in some cases, it is difficult to uniformly process films.

SUMMARY OF THE INVENTION

Some embodiments of the present disclosure provide a technique capable of improving uniformity of substrate processing.

According to embodiments of the present disclosure, there is provided a technique, which includes: a process chamber in which a substrate is processed; a plurality of first electrodes; a plurality of second electrodes; a high-frequency power supply configured to supply a high-frequency power; a high-frequency power application plate configured to connect the plurality of first electrodes to the high-frequency power supply; and a grounding plate configured to ground the plurality of second electrodes.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Embodiments of the present disclosure will be now described with reference to FIGS. 1 to 12. The drawings used in the following description are schematic, and dimensional relationships, ratios, and the like of various components shown in figures may not match actual ones. Further, dimensional relationships, ratios, and the like of various components among plural figures may not match one another.

(1) Structure of Substrate Processing Apparatus

Heater

Figure 1:
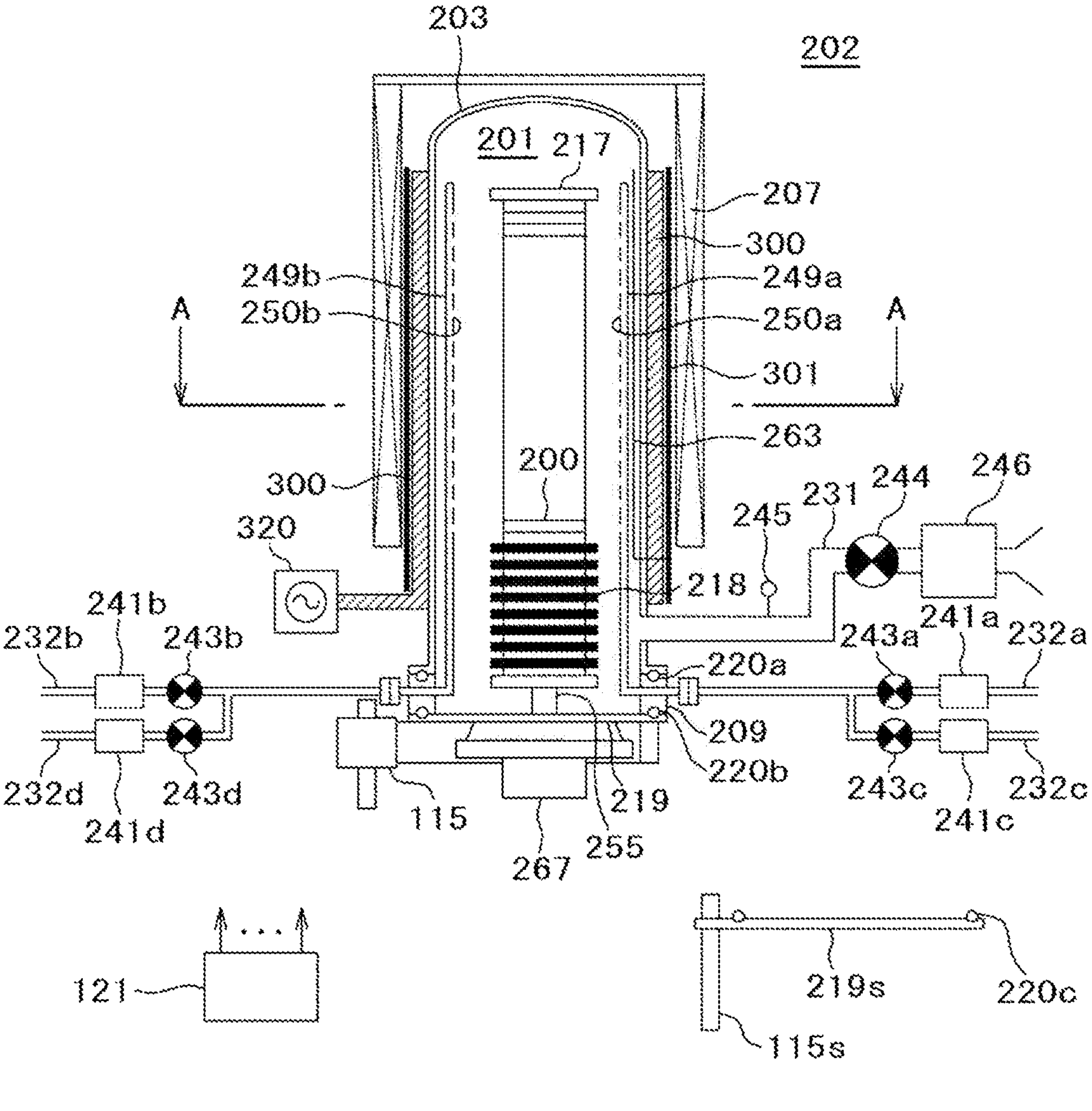
FIG. 1 is a schematic configuration view of a vertical process furnace of a substrate processing apparatus suitably used in embodiments of the present disclosure, in which a portion of the process furnace is shown in a longitudinal cross-sectional view.

As shown in FIG. 1, a process furnace 202 includes a heater 207 as a heating apparatus (a heating mechanism or a heating part). The heater 207 is formed in a cylindrical shape and is supported by a holding plate to be vertically installed. The heater 207 functions as an activator (an exciter) configured to thermally activate (excite) a gas.

Process Chamber

An electrode fixture 301, which will be described later, is disposed at an inner side of the heater 207, and an electrode 300 of a plasma generator, which will be described later, is disposed at an inner side of the electrode fixture 301. Further, a reaction tube 203 is disposed at an inner side of the electrode 300 to be concentric with the heater 207. The reaction tube 203 is made of heat resistant material such as quartz ($SiO_2$) or silicon carbide (SiC) and is formed in a cylindrical shape with its upper end closed and its lower end opened. A manifold 209 is disposed under the reaction tube 203 to be concentric with the reaction tube 203. The manifold 209 is made of metal such as stainless steel (SUS) and is formed in a cylindrical shape with both of its upper and lower ends opened. The upper end of the manifold 209 engages with the lower end of the reaction tube 203 to support the reaction tube 203. An O-ring 220*a* serving as a seal is installed between the manifold 209 and the reaction tube 203. As the manifold 209 is supported by a heater base, the reaction tube 203 is in a state of being vertically installed. A process container (reaction container) mainly includes the reaction tube 203 and the manifold 209. A process chamber 201 is formed in a hollow cylindrical portion of the process container. The process chamber 201 is configured to be capable of accommodating a plurality of wafers 200 as substrates. The process container is not limited to the above-described structure, and the reaction tube 203 may be referred to as the process container.

Gas Supplier

Nozzles 249*a* and 249*b* as first and second suppliers are respectively installed in the process chamber 201 to penetrate a sidewall of the manifold 209. The nozzles 249*a* and 249*b* are also referred to as first and second nozzles, respectively. The nozzles 249*a* and 249*b* are made of heat resistant material such as quartz or SiC. Gas supply pipes 232*a* and 232*b* are connected to the nozzles 249*a* and 249*b*, respectively. In this way, the two nozzles 249*a* and 249*b* and the two gas supply pipes 232*a* and 232*b* are installed in the process container, thereby allowing plural kinds of gases to be supplied into the process chamber 201. When the reaction tube 203 is used as the process container, the nozzles 249*a* and 249*b* may be installed to penetrate a sidewall of the reaction tube 203.

Mass flow controllers (MFCs) 241*a* and 241*b*, which are flow rate controllers (flow rate control parts), and valves 243*a* and 243*b*, which are opening/closing valves, are installed at the gas supply pipes 232*a* and 232*b*, respectively, sequentially from the upstream side of gas flow. Gas supply pipes 232*c* and 232*d* configured to supply an inert gas are connected to the gas supply pipes 232*a* and 232*b* at the downstream sides of the valves 243*a* and 243*b*, respectively. MFCs 241*c* and 241*d* and valves 243*c* and 243*d* are installed in the gas supply pipes 232*c* and 232*d*, respectively, sequentially from the upstream direction.

Figure 2:
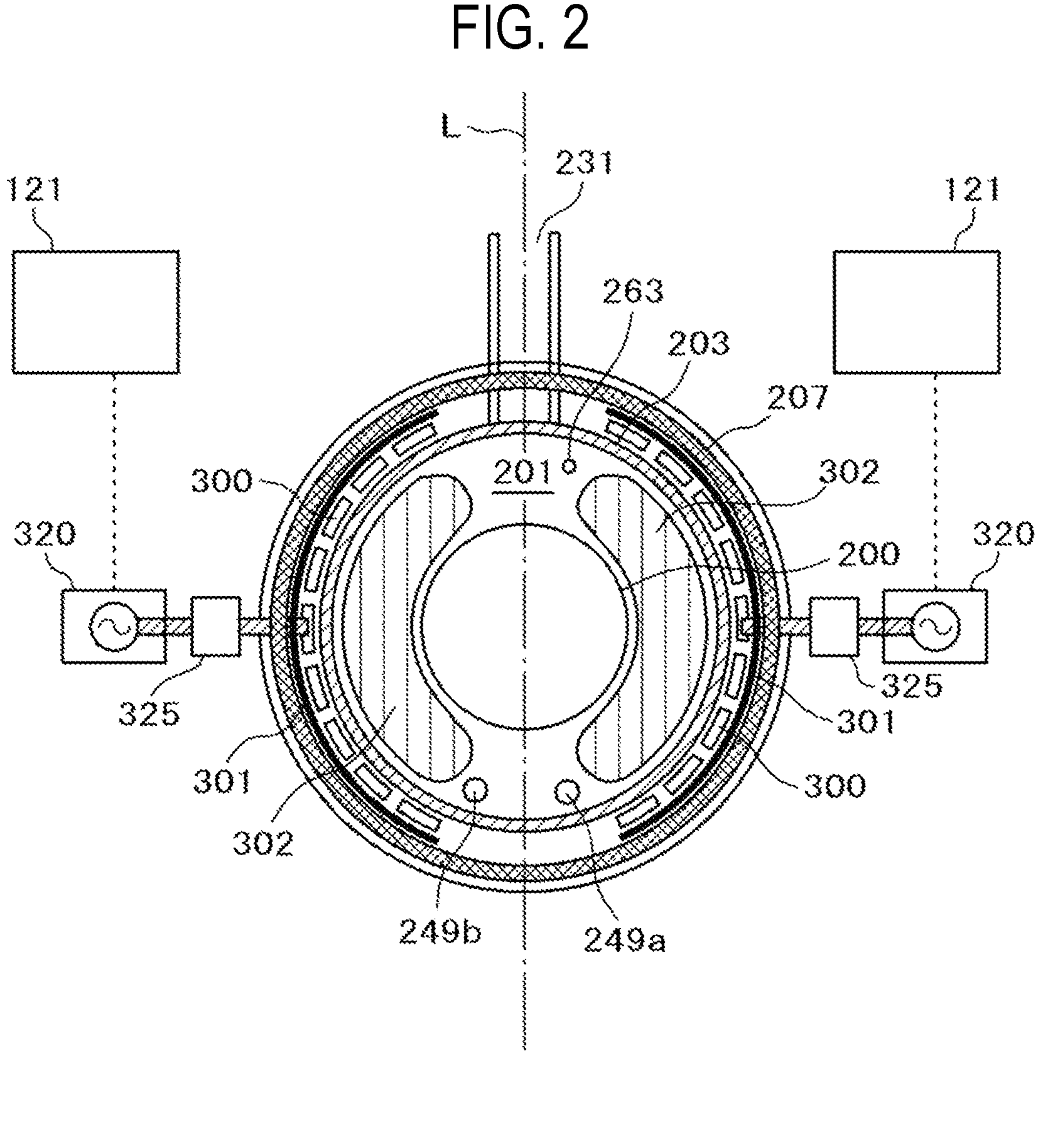
FIG. 2 is an A-A cross-sectional view of the substrate processing apparatus shown in FIG. 1.

As shown in FIGS. 1 and 2, the nozzles 249*a* and 249*b* are installed in an annular space, in the plane view, between an inner wall of the reaction tube 203 and the wafers 200 to extend upward along a stack direction of the wafers 200 from a lower side to an upper side of the inner wall of the reaction tube 203. Specifically, the nozzles 249*a* and 249*b* are each installed in a perpendicular relationship with surfaces (flat surfaces) of the wafers 200 at a lateral side of ends (peripheral edges) of the wafers 200, which are loaded into the process chamber 201. Gas supply holes 250*a* and 250*b* configured to supply a gas are formed on the side surfaces of the nozzles 249*a* and 249*b*, respectively. The gas supply hole 250*a* is opened toward the center of the reaction tube 203 to allow the gas to be supplied toward the wafers 200. A plurality of gas supply holes 250*a* and 250*b* are each formed from the lower side to the upper side of the reaction tube 203.

In this way, in the embodiments of the present disclosure, a gas is transferred via the nozzles 249*a* and 249*b* disposed in a annular vertically long space, that is, a cylindrical space, in the plane view defined by the inner wall of the sidewall of the reaction tube 203 and the ends (peripheral edges) of the plurality of wafers 200 arranged in the reaction tube 203. Then, the gas is jetted into the reaction tube 203 for the first time in the vicinity of the wafers 200 from the gas supply holes 250*a* and 250*b* opened in the nozzles 249*a* and 249*b*, respectively. The main flow of the gas in the reaction tube 203 is parallel to the surfaces of the wafers 200, that is, in a horizontal direction. With such a structure, the gas may be uniformly supplied to the respective wafers 200, and uniformity of a film thickness of a film formed on each wafer 200 may be improved. A gas that flowed on the surface of the wafer 200, that is, a residual gas after reaction, flows toward an exhaust port, that is, an exhaust pipe 231 which will be described later. However, the direction of flow of this residual gas is appropriately specified depending on a position of the exhaust port, and is not limited to a vertical direction.

A precursor (precursor gas) is supplied from the gas supply pipe 232*a* into the process chamber 201 via the MFC 241*a*, the valve 243*a*, and the nozzle 249*a*.

A reactant (reaction gas), for example, an oxygen (O)-containing gas, is supplied from the gas supply pipe 232*b* into the process chamber 201 via the MFC 241*b*, the valve 243*b*, and the nozzle 249*b*.

An inert gas is supplied from the gas supply pipes 232*c* and 232*d* into the process chamber 201 via the MFCs 241*c* and 241*d*, the valves 243*c* and 243*d*, and the nozzles 249*a* and 249*b*, respectively.

A precursor supply system as a first gas supply system mainly includes the gas supply pipe 232*a*, the MFC 241*a*, and the valve 243*a*. A reactant supply system (reaction gas supply system) as a second gas supply system mainly includes the gas supply pipe 232*b*, the MFC 241*b*, and the valve 243*b*. An inert gas supply system mainly includes the gas supply pipes 232*c* and 232*d*, the MFCs 241*c* and 241*d*, and the valves 243*c* and 243*d*. The precursor supply system, the reactant supply system, and the inert gas supply system are also simply referred to as a gas supply system (gas supplier).

Substrate Support

As shown in FIG. 1, a boat 217 serving as a substrate support is configured to support a plurality of wafers 200, for example, 25 to 200 wafers 200, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are supported in multiple stages below the boat 217. This structure makes it difficult to transfer heat from the heater 207 to a seal cap 219 side. However, the embodiments of the present disclosure is not limited to such a form. For example, instead of installing the heat insulating plates 218, a heat insulating cylinder constituted by a cylindrical member made of heat resistant material such as quartz or SiC may be installed below the boat 217.

Plasma Generator

Next, a plasma generator will be described with reference to FIGS. 1 to 7B.

An electrode 300 configured to generate a plasma is provided outside the reaction tube 203, that is, outside the process container (the process chamber 201). By applying power to the electrode 300, it is possible to excite a gas by turning the gas into plasma inside the reaction tube 203, that is, inside the process container (the process chamber 201), that is, excite the gas into a plasma state. Hereinafter, by exciting the gas into the plasma state and simply applying the same, the plasma generates capacitively-coupled plasma (abbreviation: CCP) inside the reaction tube 203, that is, inside the process container (the process chamber 201).

Specifically, as shown in FIG. 2, the electrode 300 and the electrode fixture 301 configured to fix the electrode 300 are disposed between the heater 207 and the reaction tube 203. The electrode fixture 301 is disposed inside the heater 207, the electrode 300 is disposed inside the electrode fixture 301, and the reaction tube 203 is disposed inside the electrode 300.

As shown in FIGS. 1 and 2, the electrode 300 and the electrode fixture 301 are respectively installed in an annular space (in the plane view) between the inner wall of the heater 207 and the outer wall of the reaction tube 203 to extend in an arrangement direction of the wafers 200 from the lower side to the upper side of the outer wall of the reaction tube 203. The electrode 300 is installed in parallel to the nozzles 249*a* and 249*b*. The electrode 300 and the electrode fixture 301 are arranged and disposed to be concentric with the reaction tube 203 and the heater 207 and in non-contact with the heater 207 in the plane view. The electrode fixture 301 is made of insulating material (insulator) and is installed to cover the electrode 300 and at least a portion of the reaction tube 203. Therefore, the electrode fixture 301 may be also referred to as a cover (quartz cover, insulating wall, or insulating plate) or an arched cross section cover (arched cross section body or arched cross section wall).

Figure 3A:
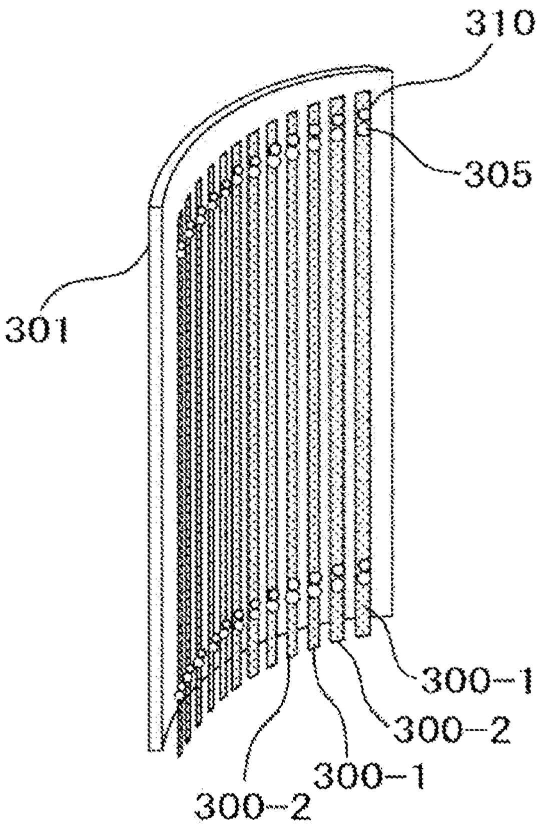
FIG. 3A is a perspective view when an electrode is installed in an electrode fixture, according to embodiments of the present disclosure.
Figure 3B:
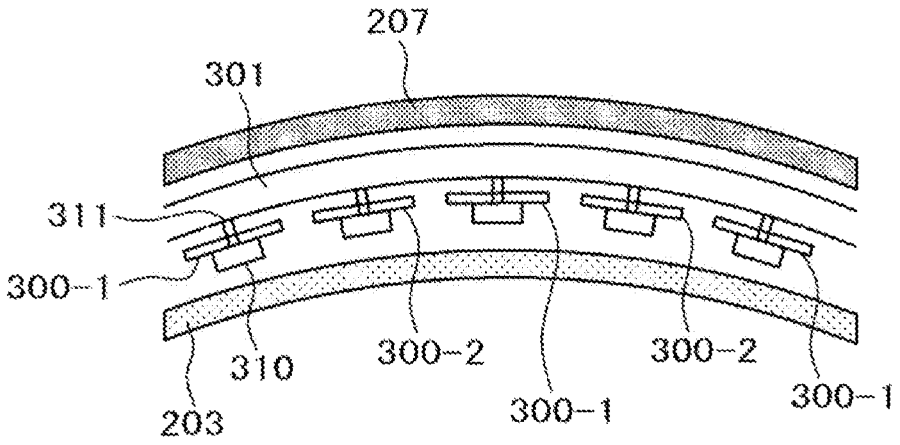
FIG. 3B is a view showing a positional relationship among a heater, an electrode fixture, an electrode, a protrusion configured to fix the electrode, and a reaction tube, according to embodiments of the present disclosure.

As shown in FIG. 2, a plurality of electrodes 300 are installed, and these plurality of electrodes 300 are installed by being fixed on the inner wall of the electrode fixture 301. More specifically, as shown in FIGS. 7A and 7B, a protrusion (hook) 310 on which an electrode 300 may be hooked is provided at the inner wall surface of the electrode fixture 301, and an opening 305, which is a through-hole through which the protrusion 310 may be inserted, is provided at the electrode 300. The electrode 300 may be fixed to the electrode fixture 301 by being hooked on the protrusion 310 provided at the inner wall surface of the electrode fixture 301 through the opening 305. FIGS. 3A to 6B show examples in which two openings 305 are provided for one electrode 300-1 or one electrode 300-2, and the one electrode 300-1 or the one electrode 300-2 are fixed by being hooked on the two protrusions 310, that is, one electrode is fixed at two points. Further, FIG. 2 shows an example in which nine electrodes 300 are fixed to one electrode fixture 301, and two set of such a structure (unit) is installed, and FIGS. 3A and 3B show an example of a structure (unit) in which eight electrodes 300-1 and 300-2 are fixed to one electrode fixture 301.

The electrode 300 (the electrodes 300-1 and 300-2) is made of an oxidation-resistant material such as nickel (Ni). Although the electrode 300 may be made of metal material such as SUS, aluminum (Al), or copper (Cu), deterioration of electrical conductivity may be suppressed by making the electrode 300 of the oxidation-resistant material such as Ni, thereby suppressing a decrease in plasma generation efficiency. Further, the electrode 300 may also be made of Ni alloy material to which Al is added, and in this case, an aluminum oxide film (AlO film), which is an oxide film with high heat resistance and corrosion resistance, may be formed on the outermost surface of the electrode 300 (the electrodes 300-1 and 300-2). The AlO film formed on the outermost surface of the electrode 300 (the electrodes 300-1 and 300-2) acts as a protective film (block film or barrier film) to suppress the progress of internal deterioration of the electrode 300. As a result, it is possible to further suppress deterioration of plasma generation efficiency due to the deterioration of electrical conductivity of the electrode 300 (the electrodes 300-1 and 300-2). The electrode fixture 301 is made of an insulating substance (insulator), for example, a heat resistant material such as quartz or SiC. The material of the electrode fixture 301 may be the same as that of the reaction tube 203.

As shown in FIGS. 2 and 3A, the electrode 300 includes a plurality of first electrodes 300-1 and a plurality of second electrodes 300-2. The first electrodes 300-1 are connected to a high-frequency power supply (RF power supply) 320 via a high-frequency power application plate, which will be described later, and a matcher 325, and an arbitrary potential is applied to the first electrodes 300-1. The second electrodes 300-2 are grounded to the ground via a grounding plate, which will be described later, such that the second electrodes 300-2 are at reference potential (0V). The first electrode 300-1 is also called a Hot electrode or a HOT electrode, and the second electrode 300-2 is also called a Ground electrode or a GND electrode. Each of the first electrode 300-1 and the second electrode 300-2 is formed as a rectangular plate-like member elongated in the vertical direction when viewed from the front. FIG. 3A shows an example in which six first electrodes 300-1 and six second electrodes 300-2 are installed. By applying RF (radio frequency) power between the first electrode 300-1 and the second electrode 300-2 from the high-frequency power supply 320 via the matcher 325, plasma is generated in a region between the first electrode 300-1 and the second electrode 300-2. This region is also called a plasma generation region. Further, as shown in FIG. 2, the electrodes 300 (the first electrode 300-1 and the second electrode 300-2) are disposed in the vertical direction (a stack direction in which the plurality of wafers 200 are stacked) with respect to the process container, on an arc in the plane view, and at equal intervals, that is, so that distances (gap) between adjacent electrodes 300 (the first electrode and the second electrode) become equal to each other. Further, the electrodes 300 (the first electrode 300-1 and the second electrode 300-2) are disposed between the reaction tube 203 and the heater 207 along the outer wall of the reaction tube 203 in substantially an arc shape in the plane view. For example, the electrodes 300 are fixed to and disposed on the inner wall surface of the electrode fixture 301 formed in the arc shape with a central angle of 30 degrees or more and 240 degrees or less. Further, as described above, the electrodes 300 (the first electrode 300-1 and the second electrode 300-2) are installed in parallel to the nozzles 249*a* and 249*b*.

Here, the electrode fixture 301 and the electrodes 300 (the first electrode 300-1 and the second electrode 300-2) may also be referred to as an electrode unit. As shown in FIG. 2, the electrode unit may be disposed at a position avoiding the nozzles 249*a* and 249*b* and the exhaust pipe 231. FIG. 2 shows an example in which two electrode units are disposed to oppose (face) each other with the center of the wafer 200 (the reaction tube 203) interposed therebetween while avoiding the nozzles 249*a* and 249*b* and the exhaust pipe 231. Further, FIG. 2 shows an example in which two electrode units are disposed with a straight line L as the axis of symmetry, that is, symmetrically, in the plane view. By disposing the electrode units in this way, it is possible to dispose the nozzles 249*a* and 249*b*, a temperature sensor 263, and the exhaust pipe 231 outside the plasma generation region in the process chamber 201, thereby preventing plasma damage thereto, wear and tear thereof, and generation of particles therefrom. In the present disclosure, the electrode units will be described as the electrode 300 in a case where they may not be specifically distinguished.

Plasma (active species) 302 is generated in the reaction tube 203 by inputting a power with a high frequency of, for example, 25 MHz or more and 35 MHz or less, more specifically, a frequency of 27.12 MHz, to the electrode 300 from the high-frequency power supply 320 via the matcher 325. The plasma 302 generated in this manner may be supplied to the surface of the wafer 200 from around the wafer 200 for substrate processing. When the frequency is less than 25 MHz, plasma damage to the substrate becomes large, and when it exceeds 35 MHz, it becomes difficult to generate the active species.

The plasma generator (plasma exciter or plasma activator) configured to excite (activate) a gas into a plasma state mainly includes the electrode 300, that is, the first electrode 300-1 and the second electrode 300-2. The electrode fixture 301, the matcher 325, and the high-frequency power supply 320 may be included in the plasma generator.

Further, as shown in FIG. 7A, the electrode 300 is formed with the opening 305 including a circular notch 303 through which a protruding head 311 (to be described later) passes, and a slide notch 304 by which a protruding shaft 312 is slid.

A thickness of the electrode 300 may be 0.1 mm or more and 1 mm or less and a width of the electrode 300 may be 5 mm or more and 30 mm or less to obtain sufficient strength and not to significantly lower an efficiency of wafer heating by a heat source. Further, the electrode 300 includes a bending structure as a deformation suppressor configured to prevent deformation due to heating by the heater 207. In this case, since the electrode 300 is interposed between the reaction tube 203 and the heater 207, an appropriate bending angle is 90 to 175 degrees due to space restrictions. Since a film is formed on the surface of the electrode by thermal oxidation and a thermal stress may cause the film to be peeled off to generate particles, the electrode 300 should not be bent too much.

In the embodiments of the present disclosure, as an example, in a vertical substrate processing apparatus, the frequency of the high-frequency power supply 320 is set to 27.12 MHz, and the electrode 300 with a length of 1 m and a thickness of 1 mm is used to generate a CCP mode plasma.

For example, as shown in FIGS. 3A and 3B, six first electrodes 300-1 with a width of 15 mm and six second electrodes 300-2 with a width of 15 mm are disposed on the outer wall of a tube-shaped reaction tube in the order of first electrode 300-1, second electrode 300-2, first electrode 300-1, second electrode 300-2, and so on with a gap of 10 mm between the first electrode 300-1 and the second electrode 300-2. Each first electrode 300-1 is formed in an integral structure, which is different from an example shown in FIGS. 6A and 6B below. Further, the first electrode 300-1 formed in the integral structure does not constitute a single electrode by a plurality of separate electrodes.

Figure 4A:
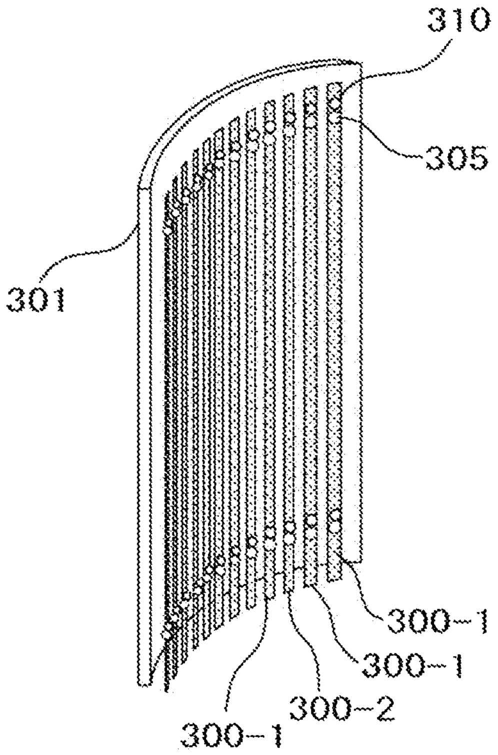
FIG. 4A is a perspective view when an electrode is installed in an electrode fixture, according to a first modification of embodiments of the present disclosure.
Figure 4B:
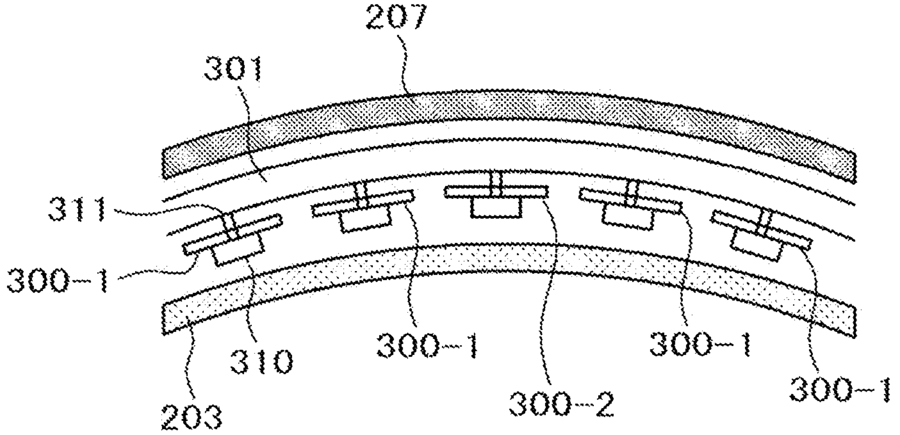
FIG. 4B is a view showing a positional relationship among a heater, an electrode fixture, an electrode, a protrusion configured to fix the electrode, and a reaction tube, according to the first modification of embodiments of the present disclosure.

For example, as shown in FIGS. 4A and 4B, eight first electrodes 300-1 with a width of 10 mm and four second electrodes 300-2 with a width of 10 mm are disposed on the outer wall of a tube-shaped reaction tube in the order of first electrode 300-1, first electrode 300-1, second electrode 300-2, first electrode 300-1, first electrode 300-1, second electrode 300-2, and so on with a gap of 10 mm between the first electrode 300-1 and the second electrode 300-2. Further, each first electrode 300-1 is formed in an integral structure, which is different from an example shown in FIGS. 6A and 6B below. Further, the first electrode 300-1 formed in the integral structure does not constitute a single electrode by a plurality of separate electrodes.

Figure 5A:
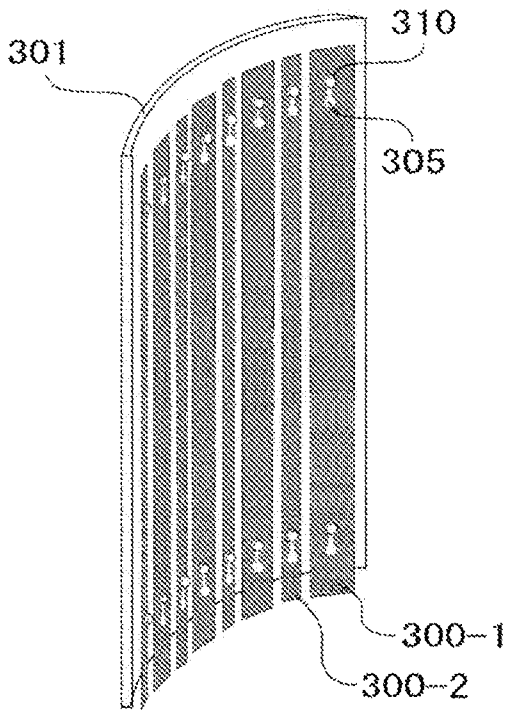
FIG. 5A is a perspective view when an electrode is installed in an electrode fixture, according to a second modification of embodiments of the present disclosure.
Figure 5B:
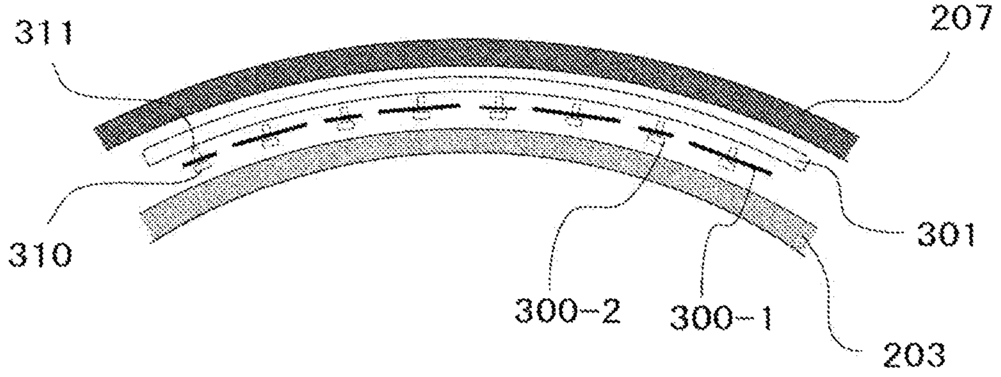
FIG. 5B is a view showing a positional relationship among a heater, an electrode fixture, an electrode, a protrusion configured to fix the electrode, and a reaction tube, according to the second modification of embodiments of the present disclosure.

For example, as shown in FIGS. 5A and 5B, four first electrodes 300-1 with a width of 25 mm and four second electrodes 300-2 with a width of 10 mm are disposed on the outer wall of a tube-shaped reaction tube in the order of first electrode 300-1, second electrode 300-2, first electrode 300-1, second electrode 300-2, and so on with a gap of 7.5 mm between the first electrode 300-1 and the second electrode 300-2. Further, each first electrode 300-1 is formed in an integral structure, which is different from an example shown in FIGS. 6A and 6B below. Further, the first electrode 300-1 formed in the integral structure does not constitute a single electrode by a plurality of separate electrodes.

Figure 6A:
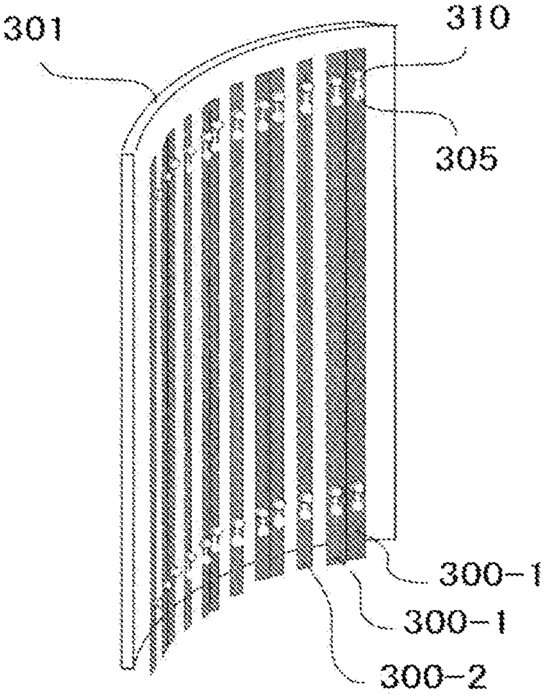
FIG. 6A is a perspective view when an electrode is installed in an electrode fixture, according to a third modification of embodiments of the present disclosure.
Figure 6B:
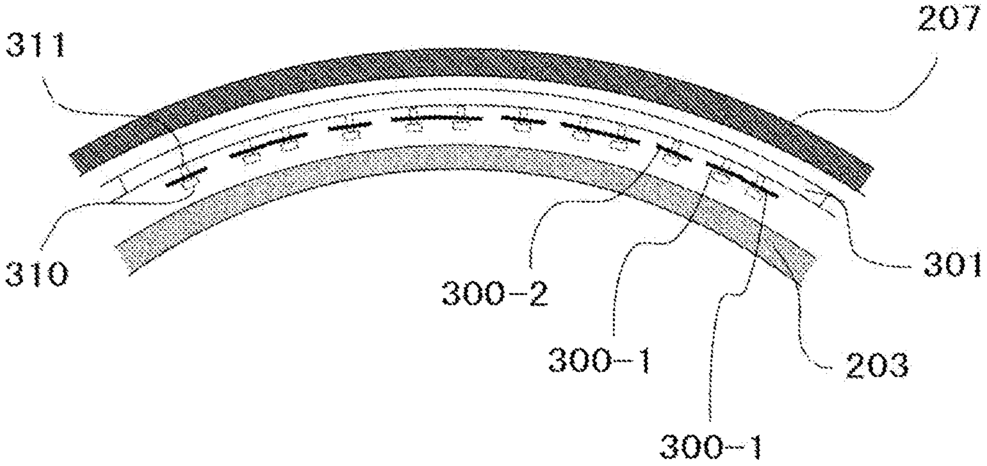
FIG. 6B is a view showing a positional relationship among a heater, an electrode fixture, an electrode, a protrusion configured to fix the electrode, and a reaction tube, according to the third modification of embodiments of the present disclosure.
Figure 7A:
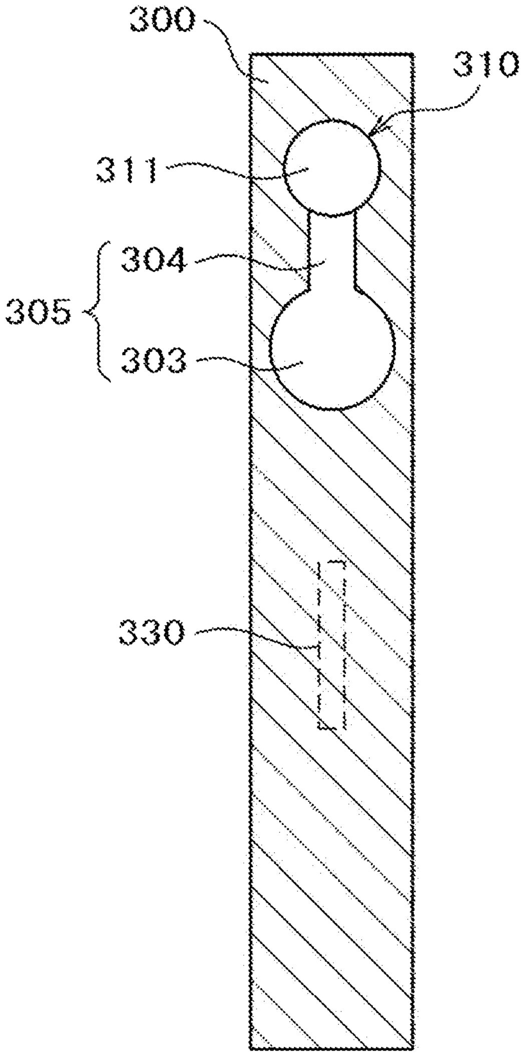
FIG. 7A is a front view of an electrode, according to embodiments of the present disclosure.
Figure 7B:
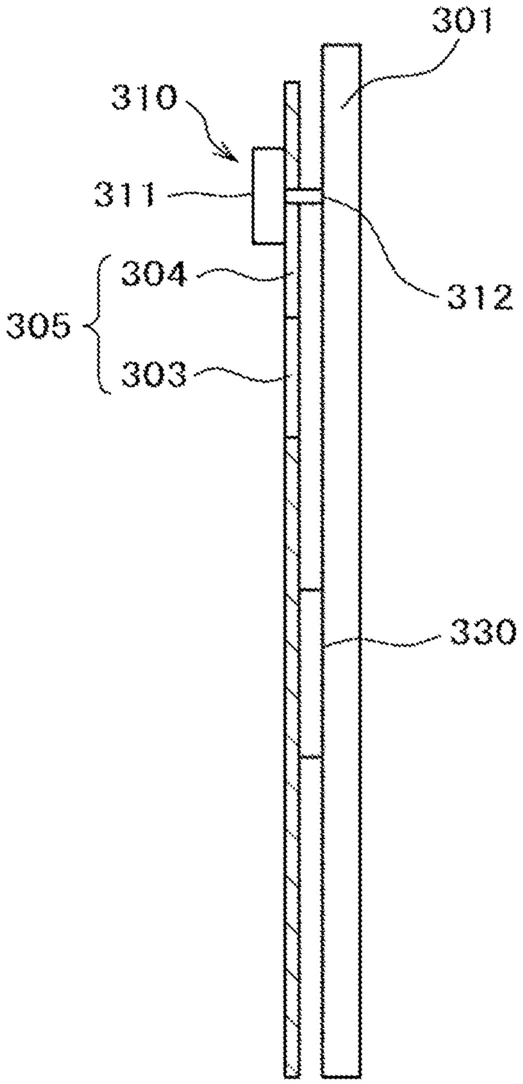
FIG. 7B is a view explaining fixation of the electrode to an electrode fixture.

Further, as shown in FIGS. 6A and 6B, eight first electrodes 300-1 with a width of 12.5 mm and four second electrodes 300-2 with a width of 10 mm may be disposed on the outer wall of a tube-shaped reaction tube in the order of first electrode 300-1, first electrode 300-1, second electrode 300-2, first electrode 300-1, first electrode 300-1, second electrode 300-2, and so on with a gap of 0 mm between the first electrode 300-1 and the first electrode 300-1 and a gap of 7.5 mm between the first electrode 300-1 and the second electrode 300-2. That is, the first electrode 300-1 and the first electrode 300-1 are disposed in contact with each other without a gap.

In FIGS. 3A, 3B, 4A, 4B, 6A, and 6B, the width (area) of the first electrode 300-1 is the same as that of the second electrode 300-2, and in FIGS. 5A and 5B, the width of the first electrode 300-1 is different from that of the second electrode 300-2 and greater than that of the second electrode 300-2. In FIGS. 3A, 3B, 4A, 4B, 6A, and 6B, the number of first electrodes 300-1 is different from the number of second electrodes 300-2, and the number of second electrodes 300-2 is double the number of first electrodes 300-1. In FIGS. 6A and 6B, the number of the first electrodes 300-1 is the same as the number of second electrodes 300-2.

Here, an internal pressure of the furnace during substrate processing may be controlled within a range of 10 Pa or more and 300 Pa or less. This is because in a case where the internal pressure of the furnace is lower than 10 Pa, a mean free path of gas molecules becomes longer than a Debye length of plasma, thereby making the plasma directly hitting a furnace wall noticeable, so it is difficult to suppress the generation of particles. Further, this is because in a case where the internal pressure of the furnace is higher than 300 Pa, the efficiency of plasma generation is saturated, and therefore, even when a reaction gas is supplied, since the amount of plasma generated does not change, the reaction gas is wasted, and at the same time, a mean free path of gas molecules becomes short, which deteriorates an efficiency of transportation of plasma active species to the wafer.

Electrode Fixing Jig

Next, the electrode fixture 301 as an electrode fixing jig configured to fix the electrode 300 will be described with reference to FIGS. 3A, 3B, 7A, and 7B. As shown in FIGS. 3A, 3B, 7A, and 7B, each of a plurality of electrodes 300 is fixed by hooking and sliding the opening 305 thereof on the protrusion 310 provided at the inner wall surface of the electrode fixture 301 which is a curved electrode fixing jig, and is installed on the outer periphery of the reaction tube 203 with the electrode 300 unitized with the electrode fixture 301 (hook-type electrode unit) to be integrated with the electrode fixture 301. Quartz and nickel alloy are used as materials for the electrode fixture 301 and the electrode 300, respectively. The electrode 300 is fixed to a pedestal which will be described later, and the electrode fixture 301 is fixed to the reaction tube 203 by a ring-shaped fixture which will be described later.

The thickness of the electrode fixture 301 may be 1 mm or more and 5 mm or less to obtain sufficient strength and not to significantly lower the efficiency of wafer heating by the heater 207. A predetermined strength against a self-weight of the electrode fixture 301 and temperature change may not be obtained in a case where the thickness of the electrode fixture 301 is less than 1 mm and the heat energy emitted from the heater 207 is absorbed in the electrode fixture 301 in a case where the thickness of the electrode fixture 301 is more than 5 mm, and therefore the heat treatment of the wafer 200 may not be properly performed.

Further, the electrode fixture 301 includes a plurality of protrusions 310 as tack-shaped fixtures configured to fix the electrodes 300 on the inner wall surface on the side of the reaction tube 203. Each protrusion 310 includes the protruding head 311 and the protruding shaft 312. The maximum width of the protruding head 311 is smaller than the diameter of the circular notch 303 of the opening 305 of the electrode 300, and the maximum width of the protruding shaft 312 is smaller than the width of the slide notch 304. The opening 305 of the electrode 300 is formed in a keyhole-like shape, the slide notch 304 may guide the protruding shaft 312 during sliding, and the protruding head 311 is formed in such a structure that the protruding head 311 does not fall out of the slide notch 304. That is, the electrode fixture 301 may be said to include a fixture provided with the protruding head 311 that is a leading end configured to prevent the electrode 300 from falling out of the protruding shaft 312 that is a columnar portion on which the electrode 300 is locked. Further, it is clear that the shapes of the opening 305 and the protruding head 311 described above are not limited to the shapes shown in FIGS. 3A, 3B, 7A, and 7B as long as the electrode 300 may be locked to the electrode fixture 301. For example, the protruding head 311 may be formed in a convex shape like a hammer or a thorn.

A constant distance may be maintained between the electrode fixture 301 or the reaction tube 203 and the electrode 300 by providing the electrode fixture 301 or the electrode 300 with an elastic body such as a spacer or a spring between them or providing the elastic body integrated with the electrode fixture 301 or the electrode 300. In the embodiments of the present disclosure, a spacer 330 as shown in FIG. 7B is integrated with the electrode fixture 301. A plurality of spacers 330 may be provided for one electrode to keep the distance between the electrode fixture 301 and the electrode 300 constant and fix them.

A high substrate processing capability may be obtained at a substrate temperature of 500 degrees C. or lower by setting an occupation rate of the electrode fixture 301 to substantially an arc shape with a central angle of 30 degrees or more and 240 degrees or less. Further, the generation of particles may be avoided, by disposing the electrode fixture 301 to avoid the exhaust pipe 231, which is the exhaust port, the nozzles 249*a* and 249*b*, and the like. That is, the electrode fixture 301 is disposed on the outer periphery of the reaction tube 203 other than positions where the nozzles 249*a* and 249*b*, which are the gas supplier installed inside the reaction tube 203, and the exhaust pipe 231, which is the gas exhauster, are installed. In the embodiments of the present disclosure, two electrode fixtures 301 with the central angle of 110 degrees are installed symmetrically in a horizontal direction.

Spacer

FIGS. 7A and 7B show the spacer 330 configured to fix the electrode 300 at a certain distance to the electrode fixture 301, which is the electrode fixing jig, and the outer wall of the reaction tube 203. For example, the spacer 330 is made of cylindrical quartz material and is integrated with the electrode fixture 301, and the electrode 300 is fixed to the electrode fixture 301 by coming into contact with the spacer 330. As long as the electrode 300 may be fixed to the electrode fixture 301 and the reaction tube 203 at a certain distance, the spacer 330 may be integrated with either the electrode 300 or the electrode fixture 301 regardless of its form. For example, the spacer 330 may be made of semi-cylindrical quartz material and may be integrated with the electrode fixture 301 to fix the electrode 300. Alternatively, the spacer 330 may be made of metal plate material such as SUS and may be integrated with the electrode 300 to fix the electrode 300. In any case, since the protrusion 310 and the spacer are provided, positioning of the electrode 300 is facilitated, and when the electrode 300 deteriorates, the electrode 300 may be replaced, resulting in cost reduction. Here, the spacer 330 may be included in the electrode unit described above.

High-Frequency Power Application Plate and Grounding Plate

Figure 8A:
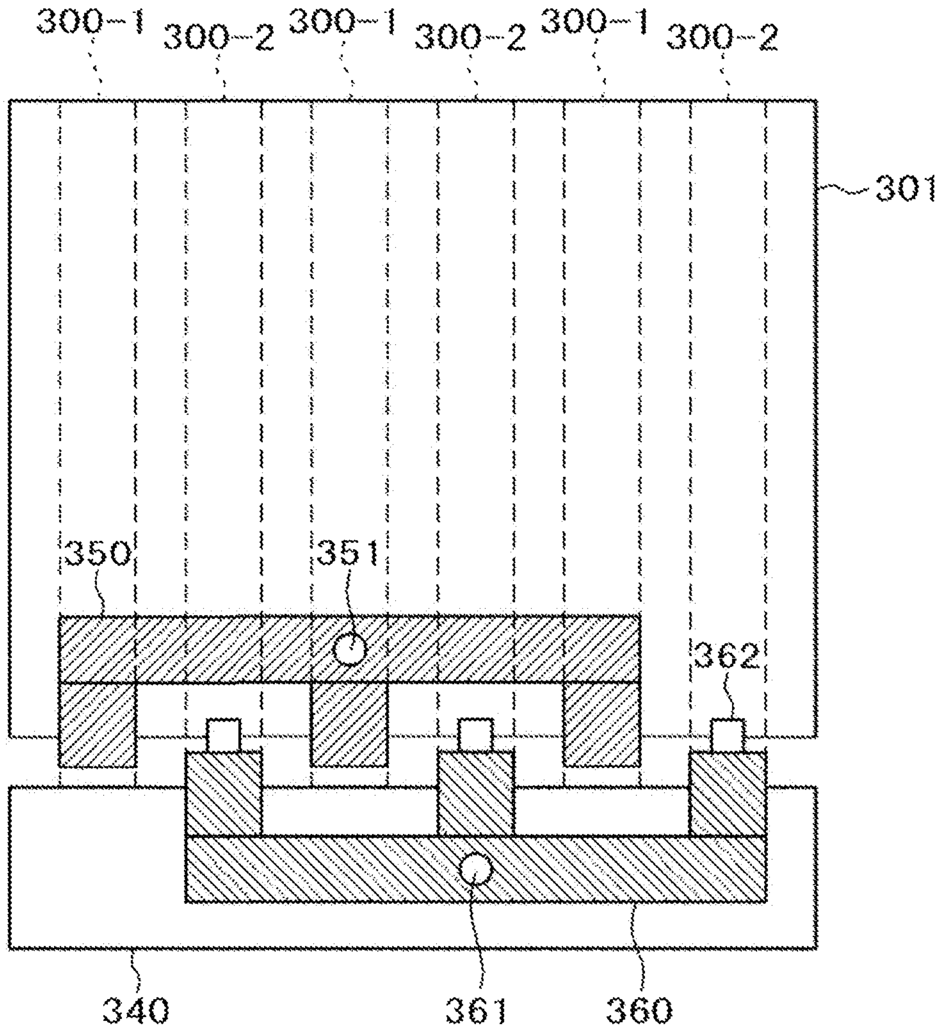
FIG. 8A is a front view when a plate is installed on a pedestal, according to embodiments of the present disclosure.
Figure 8B:
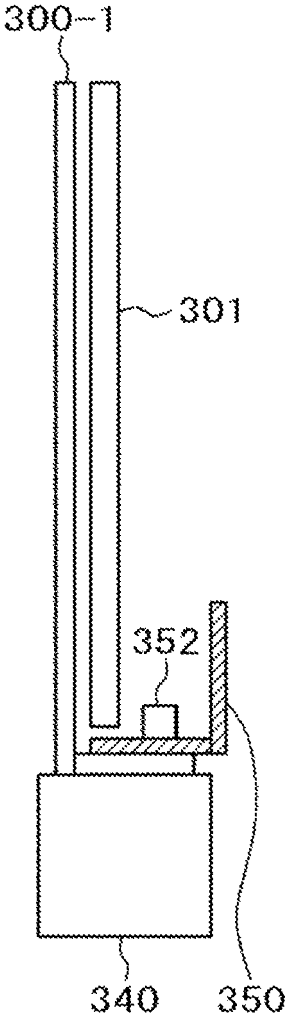
FIG. 8B is a view showing a positional relationship among a first electrode, an electrode fixing jig, a pedestal, a high-frequency power application plate, and a fixture, according to embodiments of the present disclosure.
Figure 8C:
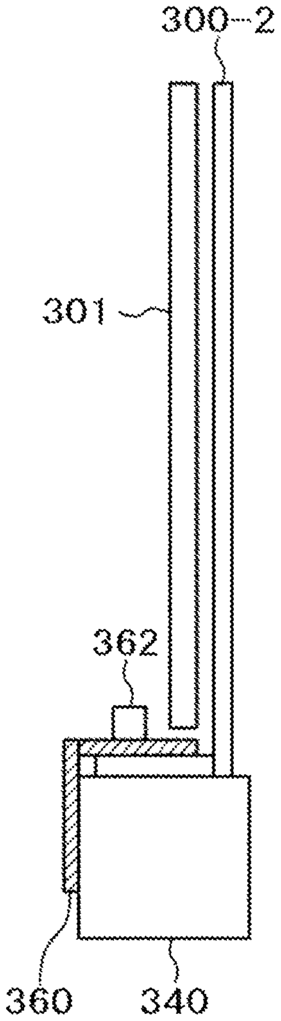
FIG. 8C is a view showing a positional relationship among a second electrode, an electrode fixing jig, a pedestal, a grounding plate, and a fixture, according to embodiments of the present disclosure.

The high-frequency power application plate and the grounding plate will be described with reference to FIGS. 8A to 8C. FIGS. 8A to 8C shows an example in which the electrodes 300 include three first electrodes 300-1 and three second electrodes 300-2, which is similar to the arrangement of the electrodes 300 shown in FIGS. 3A and 3B.

The high-frequency power application plate 350 is configured to connect a plurality of first electrodes 300-1 to the high-frequency power supply 320 and is provided at the lower sides of the plurality of first electrodes 300-1. The high-frequency power application plate 350 includes vertical portions respectively provided to extend upward from the lower sides of the three first electrodes 300-1, respectively, and a horizontal portion that connects the three vertical portions. A feeding cable that connects to the high-frequency power supply 320 is connected at a center position 351 of the high-frequency power application plate 350. The central position 351 is a position where the first electrode 300-1 in the middle of the three first electrodes 300-1 intersects the horizontal portion of the high-frequency power application plate 350. The high-frequency power application plate 350 is fixed by a fixture 352 to a pedestal 340 made of an insulator such as ceramic or resin together with a plurality of first electrodes 300-1. As a result, the plurality of first electrodes 300-1 and the high-frequency power application plate 350 are electrically connected, such that one high-frequency power application plate 350 may supply high-frequency power to the plurality of first electrodes 300-1. Further, by connecting to the high-frequency power supply 320 at the central position 351 of the high-frequency power application plate 350, the high-frequency power may be uniformly supplied by the plurality of first electrodes 300-1. Further, by providing the high-frequency power application plate 350 in the lower sides of the plurality of first electrodes 300-1, the high-frequency power application plate 350 and the plurality of first electrodes 300-1 may be fixed together to the pedestal 340 by the fixture 352.

The grounding plate 360 is configured to ground a plurality of second electrodes 300-2 and is provided at the lower sides of the plurality of second electrodes 300-2. The grounding plate 360 includes vertical portions provided to extend downward from the lower sides of the three second electrodes 300-2, respectively, and a horizontal portion that connects the three vertical portions. A feeding cable that connects to the ground is connected and grounded at a center position 361 of the grounding plate 360. The central position 361 is a position where a virtual line in an extension direction of the second electrode 300-2 in the middle of the three second electrodes 300-2 intersects the horizontal portion of the grounding plate 360. The grounding plate 360 is fixed by a fixture 362 to the pedestal 340 together with a plurality of second electrodes 300-2. As a result, the plurality of second electrodes 300-2 and the grounding plate 360 are electrically connected, such that the plurality of second electrodes 300-2 may be grounded by one grounding plate 360. Further, by grounding at the central position 361 of the grounding plate 360, the ground potential may be uniformly supplied by the plurality of second electrodes 300-2. Further, by providing the grounding plate 360 in the lower sides of the plurality of second electrodes 300-2, the grounding plate 360 and the plurality of second electrodes 300-2 may be fixed together to the pedestal 340 by the fixture 362.

The fixing of the electrode 300 and the pedestal 340 also serves as the fixing of the plate, but since the high-frequency power application plate 350 and the grounding plate 360 are separated from each other and the pedestal 340 is formed of insulating material, the first electrode 300-1 and the second electrode 300-2 are electrically separated from each other. Since power is fed to the plurality of first electrodes and the plurality of second electrodes by the high-frequency power application plate and the grounding plate, respectively, space may be saved. By connecting the feeding cables to the central portions of the high-frequency power application plate 350 and the grounding plate 360, respectively, it is possible to uniformly apply high-frequency power to the electrodes.

Figure 9A:
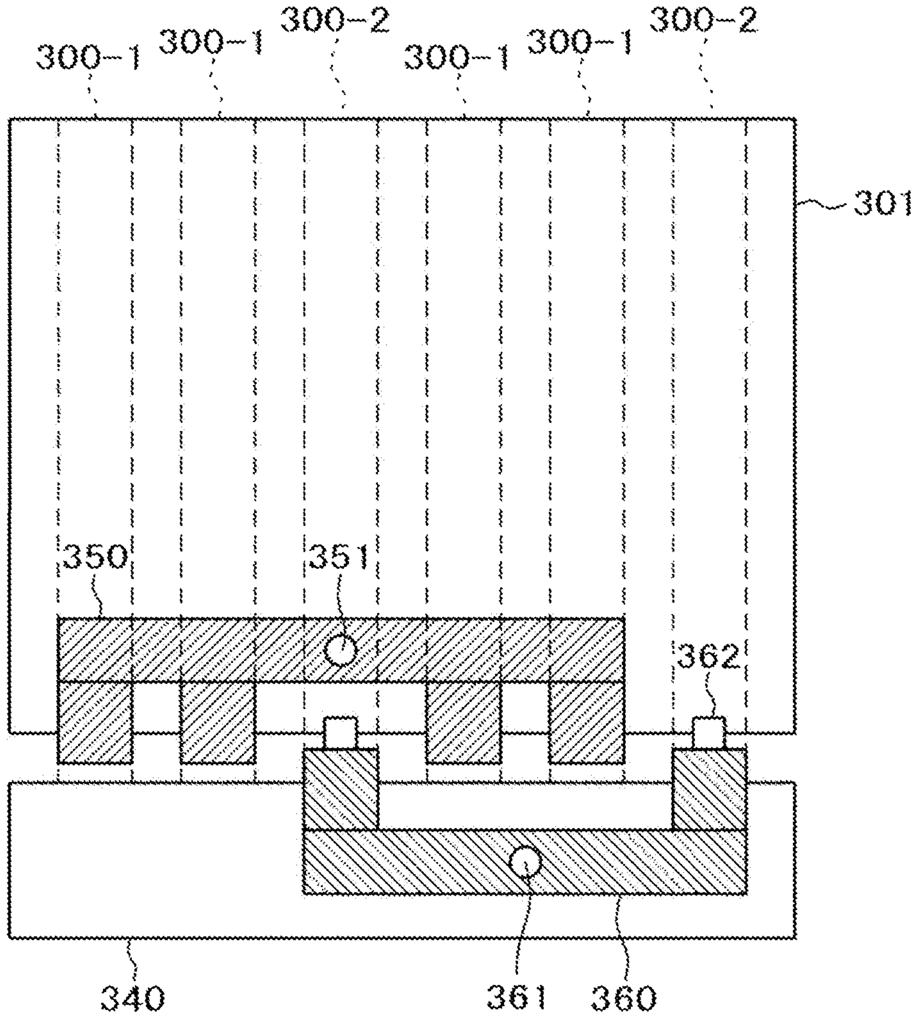
FIG. 9A is a front view when a plate is installed on a pedestal, according to the first modification of embodiments of the present disclosure.
Figure 9B:
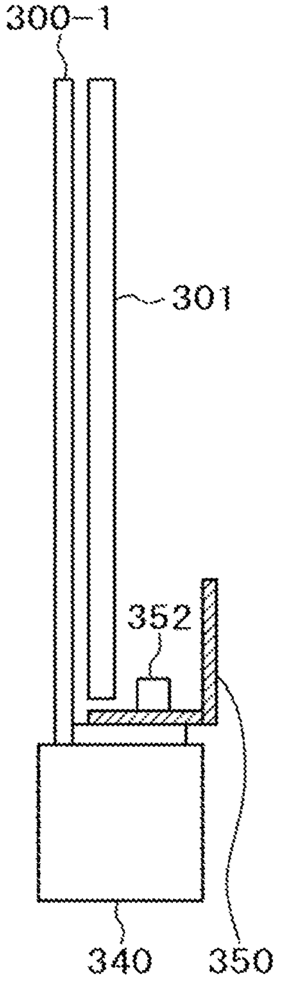
FIG. 9B is a view showing a positional relationship among a first electrode, an electrode fixing jig, a pedestal, a high-frequency power application plate, and a fixture, according to the first modification of embodiments of the present disclosure.
Figure 9C:
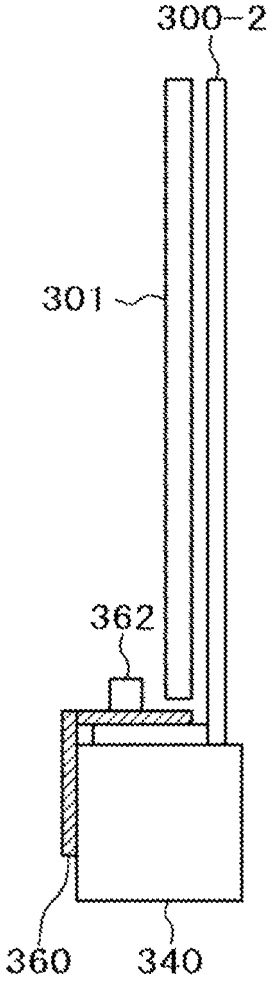
FIG. 9C is a view showing a positional relationship among a second electrode, an electrode fixing jig, a pedestal, a grounding plate, and a fixture, according to the first modification of embodiments of the present disclosure.

The procedure of installing the electrode unit will be described with reference to FIGS. 7A to 9C. First, as shown in FIGS. 7A and 7B, the electrode 300 is mounted on the electrode fixture 301. Subsequently, the lower side of the electrode 300 is fixed to the pedestal 340. Subsequently, as shown in FIGS. 9A to 9C, a ring-shaped fixture 370 formed of heat resistant member such as quartz fixes the electrode fixture 301 and the reaction tube 203 by covering the upper side of the electrode fixture 301 and the upper side of the reaction tube 203. Finally, as shown in FIGS. 8A to 8C, the high-frequency power application plate 350 and the grounding plate 360 are attached via the electrode 300 of the pedestal 340. By fixing the electrode fixture 301 with the ring-shaped fixture 370, it is possible to prevent the electrode unit from overturning.

In the arrangement of the electrodes 300 shown in FIGS. 4A to 6B as well, a high-frequency power application plate and a grounding plate similar to those in FIGS. 8A to 8C may be provided to feed power to the electrodes 300. The high-frequency power application plate and the grounding plate in the arrangement of the electrodes 300 shown in FIGS. 4A and 4B will be described with reference to FIGS. 9A to 9C. FIGS. 9A to 9C show an example in which the electrodes 300 include four first electrodes 300-1 and two second electrodes 300-2, which is a case similar to the arrangement of the electrodes 300 shown in FIGS. 4A and 4B.

As shown in FIGS. 9A to 9C, the high-frequency power application plate 350 is configured to connect a plurality of first electrodes 300-1 to the high-frequency power supply 320 and is provided at the lower sides of the plurality of first electrodes 300-1. The high-frequency power application plate 350 includes vertical portions provided to extend upward from the lower sides of the four first electrodes 300-1, respectively, and a horizontal portion that connects the four vertical portions. A feeding cable that connects to the high-frequency power supply 320 is connected at a central position 351 of the high-frequency power application plate 350. The central position 351 is a position where a second electrode 300-2 disposed between two first electrodes 300-1 intersects the horizontal portion of the high-frequency power application plate 350. The high-frequency power application plate 350 is fixed to the pedestal 340 by the fixture 352 together with a plurality of first electrodes 300-1.

The grounding plate 360 is configured to ground a plurality of second electrodes 300-2 and is provided at the lower sides of the plurality of second electrodes 300-2. The grounding plate 360 includes vertical portions provided to extend downward from the lower sides of the two second electrodes 300-2, respectively, and a horizontal portion that connects the two vertical portions. A feeding cable that connects to the ground is connected and grounded at a central position 361 of the grounding plate 360. The central position 361 is a position where a virtual line in a direction in which a gap between two first electrodes 300-1 disposed between the two second electrodes 300-2 extends intersects the horizontal portion of the grounding plate 360. The grounding plate 360 is fixed by the fixture 362 to the pedestal 340 together with a plurality of second electrodes 300-2.

Figure 10A:
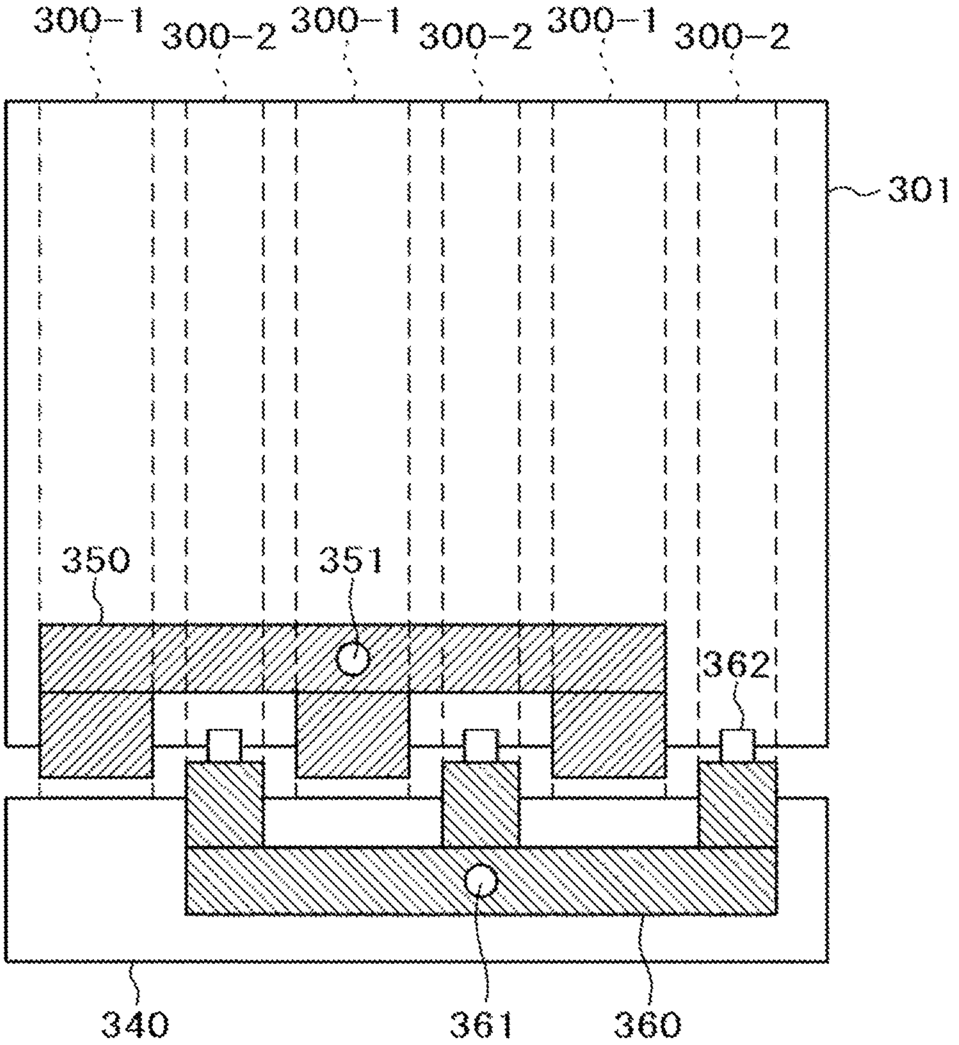
FIG. 10A is a front view when a plate is installed on a pedestal, according to the second modification of embodiments of the present disclosure.
Figure 10B:
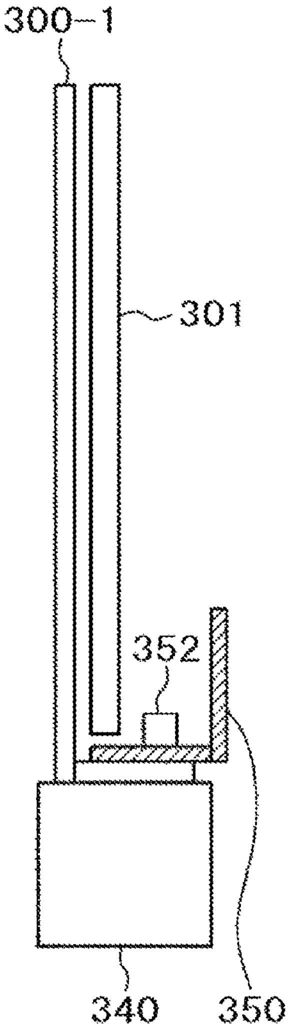
FIG. 10B is a view showing a positional relationship among a first electrode, an electrode fixing jig, a pedestal, a high-frequency power application plate, and a fixture, according to the second modification of embodiments of the present disclosure.
Figure 10C:
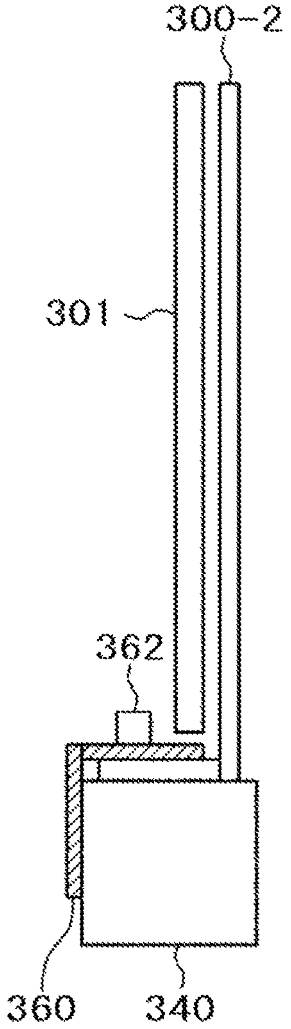
FIG. 10C is a view showing a positional relationship among a second electrode, an electrode fixing jig, a pedestal, a grounding plate, and a fixture, according to the second modification of embodiments of the present disclosure.
Figure 11:
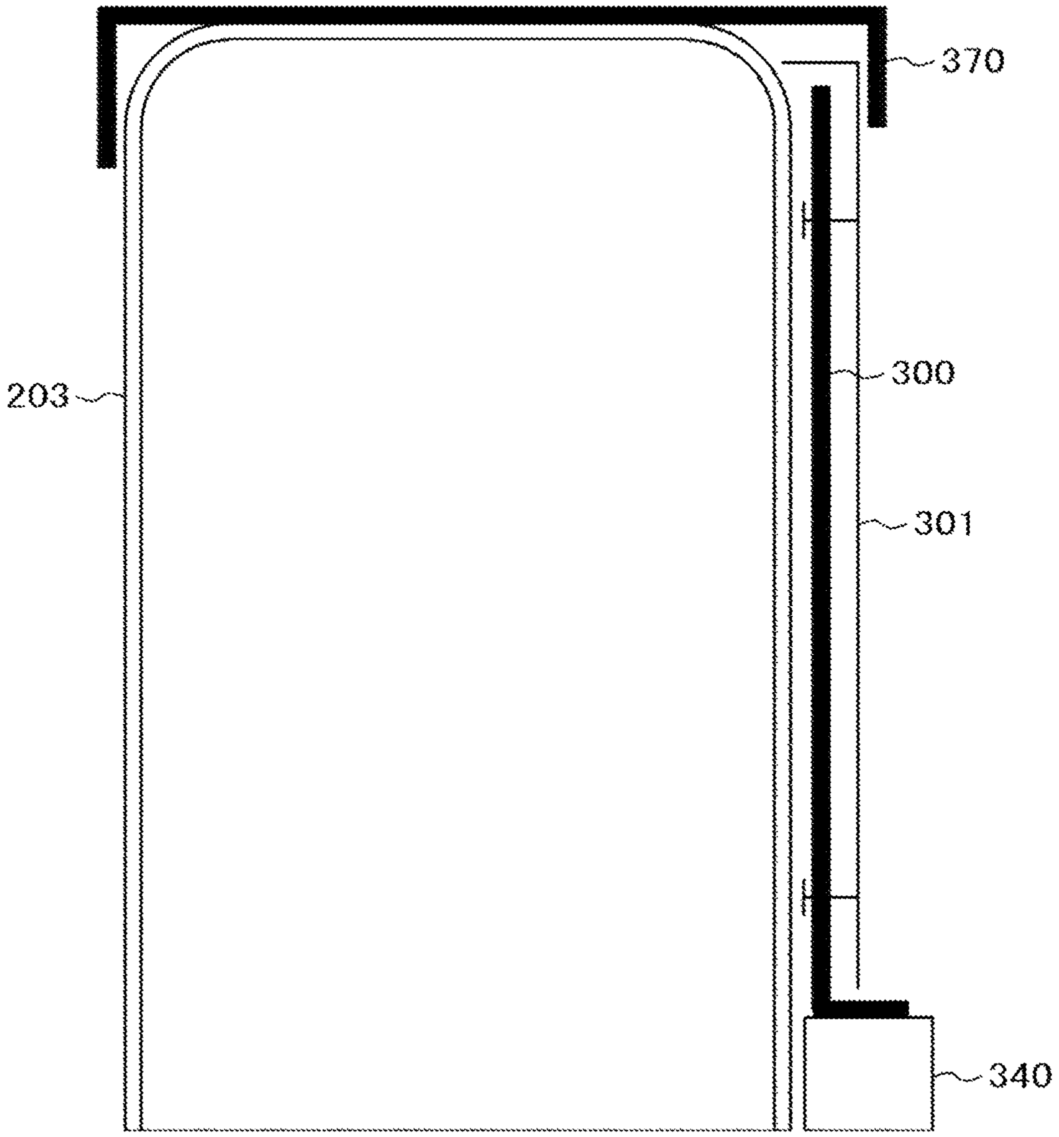
FIG. 11 is a view showing a positional relationship among a reaction tube, an electrode, an electrode fixing jig, a pedestal, and a ring-shaped fixture, according to embodiments of the present disclosure.

The high-frequency power application plate and the grounding plate in the arrangement of the electrodes 300 shown in FIGS. 5A and 5B will be described with reference to FIGS. 10A to 10C. FIGS. 10A to 10C shows an example in which the electrodes 300 include three first electrodes 300-1 and three second electrodes 300-2, which is a case similar to the arrangement of the electrodes 300 shown in FIGS. 5A and 5B.

As shown in FIGS. 10A to 10C, the high-frequency power application plate 350 is configured to connect a plurality of first electrodes 300-1 to the high-frequency power supply 320 and is provided at the lower sides of the plurality of first electrodes 300-1. The high-frequency power application plate 350 includes vertical portions provided to extend upward from the lower sides of the three first electrodes 300-1 respectively and a horizontal portion that connects the three vertical portions. A feeding cable that connects to the high-frequency power supply 320 is connected at a central position 351 of the high-frequency power application plate 350. The central position 351 is a position where the first electrode 300-1 in the middle of the three first electrodes 300-1 intersects the horizontal portion of the high-frequency power application plate 350. The high-frequency power application plate 350 is fixed to the pedestal 340 by the fixture 352 together with a plurality of first electrodes 300-1.

The grounding plate 360 is configured to ground a plurality of second electrodes 300-2 and is provided at the lower sides of the plurality of second electrodes 300-2. The grounding plate 360 includes vertical portions provided to extend downward from the lower sides of the three second electrodes 300-2 respectively and a horizontal portion that connects the three vertical portions. A feeding cable that connects to the ground is connected and grounded at a central position 361 of the grounding plate 360. The central position 361 is a position where a virtual line in an extension direction of the second electrode 300-2 in the middle of the three second electrodes 300-2 intersects the horizontal portion of the grounding plate 360. The grounding plate 360 is fixed by the fixture 362 to the pedestal 340 together with a plurality of second electrodes 300-2.

Exhauster

As shown in FIG. 1, the exhaust pipe 231 configured to exhaust an internal atmosphere of the process chamber 201 is installed in the reaction tube 203. A vacuum pump 246 as a vacuum-exhauster is connected to the exhaust pipe 231 via a pressure sensor 245, which is a pressure detector (pressure detection part) configured to detect an internal pressure of the process chamber 201, and an auto pressure controller (APC) valve 244, which is an exhaust valve (pressure regulator). The APC valve 244 is configured to be capable of performing or stopping a vacuum-exhausting operation in the process chamber 201 by opening or closing the valve while the vacuum pump 246 is actuated, and is further configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246. The exhaust pipe 231 is not limited to being installed at the reaction tube 203, but may be installed at the manifold 209 in the same manner as the nozzles 249*a* and 249*b*.

Peripheral Apparatus

A seal cap 219, which serves as a furnace opening lid configured to be capable of hermetically sealing a lower end opening of the manifold 209, is installed under the manifold 209. The seal cap 219 is configured to contact the lower end of the manifold 209 from the lower side in the vertical direction. The seal cap 219 is made of metal material such as SUS and is formed in a disc shape. An O-ring 220*b*, which is a seal making contact with the lower end of the manifold 209, is installed on an upper surface of the seal cap 219.

A rotator 267 configured to rotate the boat 217 is installed at the opposite side of the seal cap 219 from the process chamber 201. A rotary shaft 255 of the rotator 267, which penetrates the seal cap 219, is connected to the boat 217. The rotator 267 is configured to rotate the wafers 200 by rotating the boat 217. The seal cap 219 is configured to be vertically moved up or down by a boat elevator 115 which is an elevation mechanism vertically installed outside the reaction tube 203. The boat elevator 115 is configured to be capable of loading/unloading the boat 217 into/out of the process chamber 201 by moving the seal cap 219 up or down.

The boat elevator 115 is configured as a transfer (a transfer mechanism) which transfers the boat 217, that is, the wafers 200, into/out of the process chamber 201. Further, a shutter 219*s*, which serves as a furnace opening lid configured to be capable of hermetically sealing a lower end opening of the manifold 209 while the seal cap 219 is moved down by the boat elevator 115, is installed under the manifold 209. The shutter 219*s* is made of metal material such as SUS and is formed in a disc shape. An O-ring 220*c*, which is a seal making contact with the lower end of the manifold 209, is installed on an upper surface of the shutter 219*s*. The opening/closing operation (elevation operation, rotation operation, or the like) of the shutter 219*s* is controlled by a shutter opening/closing mechanism 115*s*.

A temperature sensor 263 serving as a temperature detector is installed in the reaction tube 203. Based on temperature information detected by the temperature sensor 263, a state of supplying electric power to the heater 207 is adjusted such that a temperature distribution in the process chamber 201 becomes a desired temperature distribution. The temperature sensor 263 is installed along the inner wall of the reaction tube 203 in the same manner as the nozzles 249*a* and 249*b*.

Controller

Figure 12:
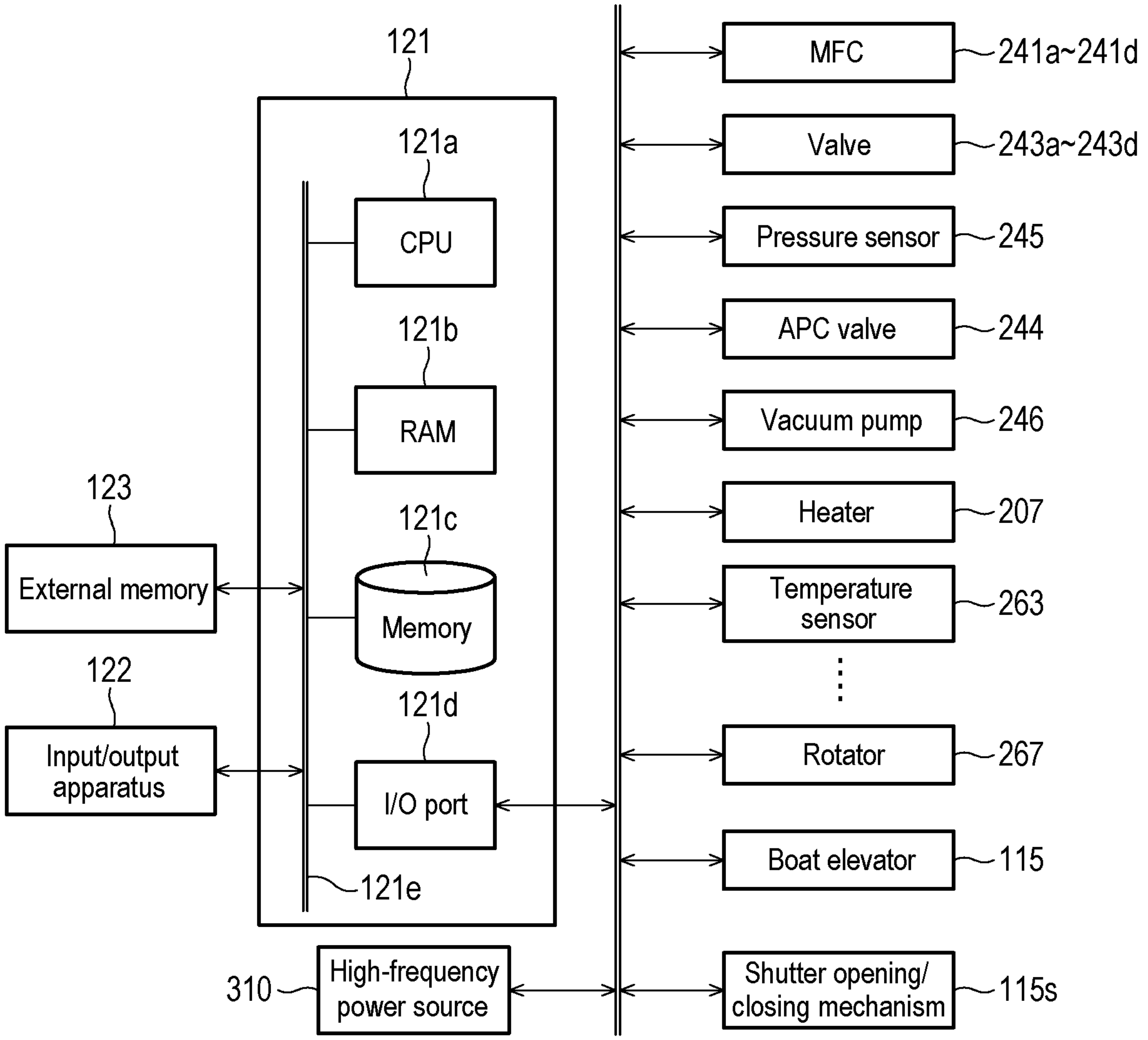
FIG. 12 is a diagram schematically showing a structure of a controller in the substrate processing apparatus shown in FIG. 1, in which an example of a control system of the controller is shown in a block diagram.

Next, a controller will be described with reference to FIG. 12. As shown in FIG. 12, a controller 121, which is a control part (control apparatus), may be constituted by a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output apparatus 122 formed of, e.g., a touch panel or the like, is connected to the controller 121.

The memory 121*c* includes, for example, a flash memory, a hard disk drive (HDD), a solid state drive (SSD), or the like. A control program that controls operations of a substrate processing apparatus and a process recipe, in which sequences and conditions of a film-forming process to be described later are written, are readably stored in the memory 121*c*. The process recipe functions as a program that causes, by the controller 121, the substrate processing apparatus to execute each sequence in various kinds of processes (film-forming processes), which will be described later, to obtain a desired result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121*b* is constituted as a memory area (work area) in which a program or data read by the CPU 121*a* is temporarily stored.

The I/O port 121*d* is connected to the MFCs 241*a* to 241*d*, the valves 243*a* to 243*d*, the pressure sensor 245, the APC valve 244, the vacuum pump 246, the heater 207, the temperature sensor 263, the rotator 267, the boat elevator 115, the shutter opening/closing mechanism 115*s*, the high-frequency power supply 320, and the like.

The CPU 121*a* is configured to read and execute the control program from the memory 121*c* and is further configured to read the recipe from the memory 121*c* according to an input of an operation command from the input/output apparatus 122. The CPU 121*a* is configured to be capable of controlling the rotator 267, the flow rate regulating operation of various kinds of gases by the MFCs 241*a* to 241*d*, the opening/closing operation of the valves 243*a* to 243*d*, the opening/closing operation of the APC valve 244, the pressure regulating operation performed by the APC valve 244 based on the pressure sensor 245, the actuating/stopping operation of the vacuum pump 246, the temperature regulating operation performed by the heater 207 based on the temperature sensor 263, the forward/backward rotation, rotation angle and rotation speed adjustment operation of the boat 217 by the rotator 267, the operation of moving the boat 217 up or down by the boat elevator 115, the opening/closing operation of the shutter 219*s* by the shutter opening/closing mechanism 115*s*, the supply of power of the high-frequency power supply 320, and the like, according to contents of the read recipe.

The controller 121 may be constituted by installing, on the computer, the aforementioned program stored in an external memory (for example, a magnetic disk such as a hard disk, an optical disc such as a CD, a magneto-optical disc such as a MO, a semiconductor memory such as a USB memory, or the like) 123. The memory 121*c* and the external memory 123 are constituted as a computer-readable recording medium. Hereinafter, the memory 121*c* and the external memory 123 may be generally and simply referred to as a "recording medium." When the term "recording medium" is used herein, it may indicate a case of including the memory 121*c*, a case of including the external memory 123, or a case of including both the memory 121*c* and the external memory 123. Furthermore, the program may be provided to the computer by using a communication means or unit such as the Internet or a dedicated line, instead of using the external memory 123.

(2) Substrate Processing Process (Substrate Treatment Method)

Figure 13:
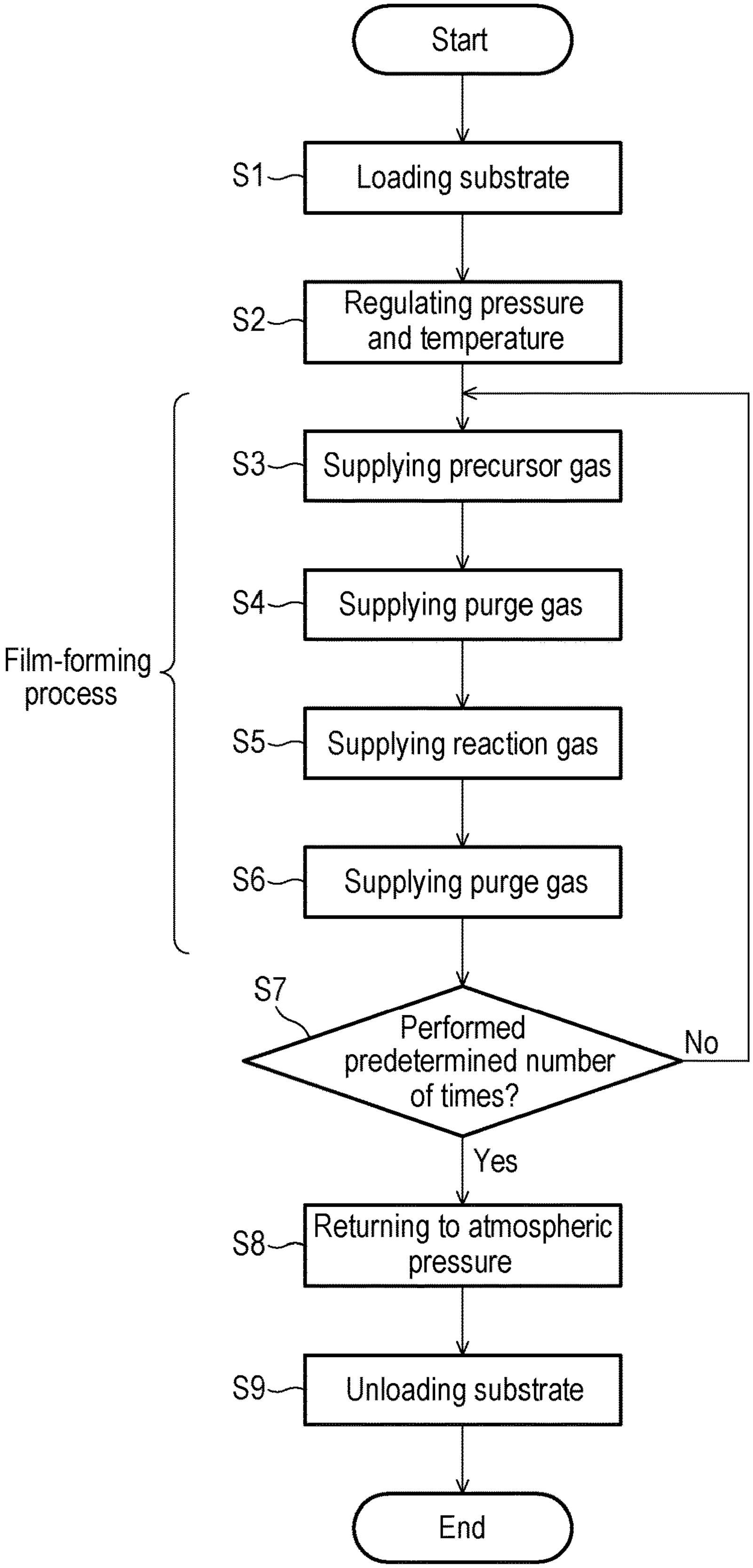
FIG. 13 is a flow chart showing an example of a substrate processing process by using the substrate processing apparatus shown in FIG. 1.

Next, as a process of manufacturing a semiconductor device, a process of forming a film on a substrate by using the above-described substrate processing apparatus will be described with reference to FIG. 13. In the following descriptions, the operations of various components constituting the substrate processing apparatus are controlled by the controller 121.

In the present disclosure, for the sake of convenience, a film-forming process sequence shown in FIG. 13 may be denoted as follows. The same notation will be used in description of modifications and other embodiments which will be described later.

$$(\text{Precursor gas} \rightarrow \text{Reaction gas}) \times n$$

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer or film formed on a wafer." When the term "substrate" is used in the present disclosure, it is synonymous with the term "wafer."

Loading Step: S1

When the boat 217 is charged with a plurality of wafers 200 (wafer charging), the shutter 219*s* is moved by the shutter opening/closing mechanism 115*s* and the lower end opening of the manifold 209 is opened (shutter open). After that, as shown in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220*b*.

Pressure/Temperature Regulating Step: S2

The interior of the process chamber 201 is vacuum-exhausted (decompression-exhausted) by the vacuum pump 246 to reach a desired pressure (a state of vacuum). At this time, the internal pressure of the process chamber 201 is measured by the pressure sensor 245. The APC valve 244 is feedback-controlled based on the measured pressure information (pressure regulation). The vacuum pump 246 keeps operating at least until a film-forming step to be described later is completed.

Further, the interior of the process chamber 201 are heated by the heater 207 to a desired temperature. At this time, the state of supplying electric power to the heater 207 is feedback-controlled based on the temperature information detected by the temperature sensor 263 such that the temperature distribution in the process chamber 201 becomes a desired temperature distribution (temperature regulation). The heating of the interior of the process chamber 201 by the heater 207 is continuously performed at least until the film-forming step to be described later is completed. However, when the film-forming step is performed under a temperature condition of equal to or lower than room temperature, the heating of the interior of the process chamber 201 by the heater 207 may not be performed. In the case where the process at such a temperature is performed, the heater 207 may not be provided. That is, the heater 207 may not be installed in the substrate processing apparatus. This may simplify the structure of the substrate processing apparatus.

Subsequently, rotation of the boat 217 and the wafers 200 by the rotator 267 is started. The rotation of the boat 217 and the wafers 200 by the rotator 267 is continuously performed at least until the film-forming step to be described later is completed.

Film-Forming Step: S3, S4, S5, and S6

After that, steps S3, S4, S5, and S6 are sequentially executed to perform a film-forming step.

Precursor Gas Supplying Step: S3 and S4

At step S3, a precursor gas is supplied to the wafers 200 in the process chamber 201.

The valve 243*a* is opened to allow the precursor gas to flow through the gas supply pipe 232*a*. A flow rate of the precursor gas is regulated by the MFC 241*a*, and the precursor gas is supplied from the gas supply hole 250*a* into the process chamber 201 via the nozzle 249*a* and is exhausted via the exhaust pipe 231. In this operation, the precursor gas is supplied to the wafers 200. At the same time, the valve 243*c* is opened to allow an inert gas to flow through the gas supply pipe 232*c*. A flow rate of the inert gas is regulated by the MFC 241*c*, and the inert gas is supplied into the process chamber 201 together with the precursor gas and is exhausted via the exhaust pipe 231.

Further, the precursor gas may be prevented from penetrating into the nozzle 249*b* by opening the valves 243*d* to allow the inert gas to flow through the gas supply pipe 232*d*. The inert gas is supplied into the process chamber 201 via the gas supply pipe 232*d* and the nozzle 249*b* and is exhausted via the exhaust pipe 231.

Process conditions in this step are exemplified as follows.

Processing temperature: room temperature (25 degrees C.) to 550 degrees C., specifically 400 to 500 degrees C.

Processing pressure: 1 to 4,000 Pa, specifically 100 to 1,000 Pa

Precursor gas supply flow rate: 0.1 to 3 slm

Precursor gas supply time: 1 to 100 seconds, specifically 1 to 50 seconds

Inert gas supply flow rate (for each gas supply pipe): 0 to 10 slm

In the present disclosure, notation of a numerical range such as "25 degrees C. to 550 degrees C." means that the lower limit value and the upper limit value are included in the range. Therefore, for example, "25 degrees C. to 550 degrees C." means "25 degrees C. or higher and 550 degrees C. or lower." The same applies to other numerical ranges. In the present disclosure, the processing temperature means the temperature of the wafer 200 or the internal temperature of the process chamber 201, and the processing pressure means the internal pressure of the process chamber 201. Further, the gas supply flow rate of 0 slm means a case where no gas is supplied. The same applies to the following description.

By supplying the precursor gas to the wafer 200 under the aforementioned conditions, a first layer is formed on the wafer 200 (a base film of a surface of the wafer 200). For example, when a silicon (Si)-containing gas, which will be described later, is used as the precursor gas, a Si-containing layer is formed as the first layer.

After the first layer is formed, the valve 243*a* is closed to stop the supply of the precursor gas into the process chamber 201. At this time, with the APC valve 244 kept open, the interior of the process chamber 201 is vacuum-exhausted by the vacuum pump 246 to remove the unreacted precursor gas or the precursor gas that contributed to the formation of the first layer, reaction by-products, and the like remaining in the process chamber 201 from the process chamber 201 (S4). Further, the valves 243*c* and 243*d* are opened to supply the inert gas into the process chamber 201. The inert gas acts as a purge gas.

As the precursor gas, it may be possible to use aminosilane-based gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(dimethylamino)silane ($Si[N(CH_3)_2]_2H_2$, abbreviation: BDMAS) gas, a bis(diethylamino)silane ($Si[N(C_2H_5)_2]_2H_2$, abbreviation: BDEAS) gas, a bis(tert-butyl) aminosilane ($SiH_2[NH(C_4H_9)]_2$, abbreviation: BTBAS) gas, and a (diisopropylamino)silane ($SiH_3[N(C_3H_7)_2]$, abbreviation: DIPAS) gas. One or more selected from the group of these gases may be used as the precursor gas.

Further, as the precursor gas, it may be possible to use chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, and an octachlorotrisilane ($Si_3Cl_8$, abbreviation: OCTS) gas, fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas. That is, a halosilane-based gas may be used as the precursor gas. One or more selected from the group of these gases may be used as the precursor gas.

Further, as the precursor gas, it may be possible to use silicon hydride gases such as a monosilane ($SiH_4$, abbreviation: MS) gas, a disilane ($Si_2H_6$, abbreviation: DS) gas, and a trisilane ($Si_3H_8$, abbreviation: TS) gas. One or more selected from the group of these gases may be used as the precursor gas.

Examples of the inert gas may include rare gases such as a nitrogen ($N_2$) gas, an argon (Ar) gas, a helium (He) gas, a neon (Ne) gas, and a xenon (Xe) gas. The same applies to each step to be described later.

Reaction Gas Supplying Step: S5 and S6

After the film-forming process is completed, a plasma-excited $O_2$ gas as a reaction gas is supplied to the wafer 200 in the process chamber 201 (S5).

In this step, the opening/closing control of the valves 243*b* to 243*d* is performed in the same procedure as the opening/closing control of the valves 243*a*, 243*c*, and 243*d* in the step S3. The flow rate of the reaction gas is regulated by the MFC 241*b*, and the reaction gas is supplied into the process chamber 201 from the gas supply hole 250*b* via the nozzle 249*b*. At this time, high-frequency power (RF power with a frequency of 27.12 MHz in the embodiments of the present disclosure) is supplied (applied) from the high-frequency power supply 320 to the electrode 300. The reaction gas supplied into the process chamber 201 is excited into a plasma state inside the process chamber 201, supplied as active species to the wafer 200, and exhausted via the exhaust pipe 231.

Process conditions in this step are exemplified as follows.

Processing temperature: room temperature (25 degrees C.) to 550 degrees C., specifically 400 to 500 degrees C.

Processing pressure: 1 to 300 Pa, specifically 10 to 100 Pa

Reaction gas supply flow rate: 0.1 to 10 slm

Reaction gas supply time: 1 to 100 seconds, specifically 1 to 50 seconds

Inert gas supply flow rate (for each gas supply pipe): 0 to 10 slm

RF power: 50 to 1,000 W

RF frequency: 27.12 MHz

By exciting the reaction gas into the plasma state and supplying the same to the wafer 200 under the aforementioned conditions, the first layer formed on the surface of the wafer 200 is modified into a second layer by the action of ions and electrically neutral active species generated in the plasma.

For example, when an oxidizing gas (oxidant) such as an oxygen (O)-containing gas is used as the reaction gas, by exciting the O-containing gas into a plasma state, O-containing active species are generated and supplied to the wafer 200. In this case, the first layer formed on the surface of the wafer 200 is oxidized, which is performed as a modifying process, by the action of the O-containing active species. In this case, when the first layer is, for example, a Si-containing layer, the Si-containing layer as the first layer is modified into a silicon oxide layer (SiO layer) as the second layer.

Further, for example, when a nitriding gas (nitriding agent) such as a nitrogen (N)- and hydrogen (H)-containing gas is used as the reaction gas, by exciting the N- and H-containing gas into a plasma state, N- and H-containing active species are generated and supplied to the wafer 200. In this case, the first layer formed on the surface of the wafer 200 is nitrided, which is performed as a modifying process, by the action of the N- and H-containing active species. In this case, when the first layer is, for example, a Si-containing layer, the Si-containing layer as the first layer is modified into a silicon nitride layer (SiN layer) as the second layer.

After the first layer is modified into the second layer, the valve **243*b* is closed to stop the supply of the reaction gas. Further, the supply of the RF power to the electrode 300 is stopped. Then, the reaction gas and reaction by-products remaining in the process chamber 201 are removed from the process chamber 201 according the same processing procedure and process conditions as in step S4 (S6**).

As described above, for example, the O-containing gas or the N- and H-containing gas may be used as the reaction gas. As the O-containing gas, it may be possible to use, for example, an $O_2$ gas, a nitrous oxide ($N_2O$) gas, a nitric oxide (NO) gas, a nitrogen dioxide ($NO_2$) gas, an ozone ($O_3$), a hydrogen peroxide ($H_2O_2$) gas, water vapor ($H_2O$), an ammonium hydroxide ($NH_4(OH)$) gas, a carbon monoxide (CO) gas, a carbon dioxide ($CO_2$) gas, and the like. As the N- and H-containing gas, it may be possible to use hydrogen nitride-based gases such as an ammonia ($NH_3$) gas, a diazene ($N_2H_2$) gas, a hydrazine ($N_2H_4$) gas, and a $N_3H_8$ gas. One or more selected from the group of these gases may be used as the reaction gas.

As an inert gas, for example, various kinds of rare gases exemplified in step S4 may be used.

Performing Predetermined Number of Times: S7

A cycle, which includes non-simultaneously, that is, without synchronization, performing the above-described steps S3, S4, S5, and S6 in this order, is performed a predetermined number of times (n times, where n is an integer of 1 or more), that is, one or more times, to thereby form a film with a predetermined composition and a predetermined film thickness on the wafer 200. The above-described cycle may be performed multiple times. That is, a thickness of the first layer formed per one cycle may be set to be smaller than a desired film thickness, and the above-described cycle may be performed multiple times until a film thickness of a film formed by laminating the second layer becomes equal to the desired film thickness. In addition, when forming, for example, a Si-containing layer as the first layer and forming, for example, a SiO layer as the second layer, a silicon oxide film (SiO film) is formed as the film. Moreover, when forming, for example, a Si-containing layer as the first layer and forming, for example, a SiN layer as the second layer, a silicon nitride film (SiN film) is formed as the film.

Returning to Atmospheric Pressure Step: S8

After the above-described film-forming process is completed, an inert gas is supplied into the process chamber 201 from each of the gas supply pipes **232*c* and 232*d* and is exhausted via the exhaust pipe 231. Thus, the interior of the process chamber 201 is purged with the inert gas to remove a reaction gas and the like remaining in the process chamber 201 from the process chamber 201 (inert gas purge). After that, the internal atmosphere of the process chamber 201 is substituted with the inert gas (inert gas substitution) and the internal pressure of the process chamber 201 is returned to an atmospheric pressure (returning to atmospheric pressure: S8**).

Unloading Step: S9

After that, the seal cap 219 is moved down by the boat elevator 115 to open the lower end of the manifold 209, and the processed wafers 200 supported by the boat 217 are unloaded from the lower end of the manifold 209 to the outside of the reaction tube 203 (boat unloading). After the boat unloading, the shutter **219*s* is moved, and the lower end opening of the manifold 209 is sealed by the shutter 219*s* via the O-ring 220*c* (shutter closing). After being unloaded to the outside of the reaction tube 203, the processed wafers 200 are discharged from the boat 217 (wafer discharging). After the wafer discharging, an empty boat 217 may be loaded into the process chamber 201**.

Here, the internal pressure of the furnace at the time of substrate processing may be controlled to fall within a range of 10 Pa to 300 Pa. This is because in a case where the internal pressure of the furnace is lower than 10 Pa, the mean free path of gas molecules becomes longer than the Debye length of the plasma and a plasma that directly hits a furnace wall becomes remarkable, which makes it difficult to suppress generation of particles. Further, this is because in a case where the internal pressure of the furnace is higher than 300 Pa, since a plasma generation efficiency is saturated, an amount of plasma generated does not change even when a reaction gas is supplied, the reaction gas is wasted, and at the same time, the mean free path of gas molecules becomes short, which deteriorates the efficiency of transportation of plasma active species to the wafer.

(3) Effects According to the Present Embodiment

According to the embodiments of the present disclosure, the high-frequency power application plate that connects a plurality of first electrodes 300-1 and the grounding plate that connects a plurality of second electrodes 300-2 are provided to perform uniform power feeding, which enables stable discharge within the wafer surface, thereby improving plasma non-uniformity within the wafer surface. Since the generation of plasma non-uniformity may be reduced, the generation of particles caused by plasma may be reduced.

The embodiments of the present disclosure are described above in detail. However, the present disclosure is not limited to the above-described embodiments, and various changes may be made without departing from the gist thereof.

Further, for example, in the above-described embodiments of the present disclosure, the example in which the reactant is supplied after the precursor is supplied are described. However, the present disclosure is not limited to such embodiments, but the order of supplying the precursor and the reactant may be reversed. That is, the precursor may be supplied after the reactant is supplied. By changing the supply order, it is possible to change film quality and composition ratio of a formed film.

The present disclosure may be also suitably applied to a case of forming a Si-based oxide film such as a silicon oxycarbide film (SiOC film), a silicon oxycarbonitride film (SiOCN film), or a silicon oxynitride film (SiON film) on the wafer 200, as well as the case of forming the SiO film or the SiN film on the wafer 200, and.

For example, as an alternative to or in addition to the above-mentioned gases, a nitrogen (N)-containing gas such as an ammonia ($NH_3$) gas, a carbon (C)-containing gas such as a propylene ($C_3H_6$) gas, a boron (B)-containing gas such as a boron trichloride ($BCl_3$) gas, or the like may be used to form, for example, a SiN film, a SiON film, a SiOCN film, a SiOC film, a SiCN film, a SiBN film, a SiBCN film, a BCN film, or the like. The order in which the respective gases flow may be changed as appropriate. Even when such film formation is performed, the film formation may be performed under the same process conditions as in the above-described embodiments of the present disclosure, and the same effects as in the above-described embodiments of the present disclosure may be obtained. In these cases, the above-mentioned reaction gas may be used as an oxidant as the reaction gas.

Further, the present disclosure may be suitably applied to a case of forming a metal-based oxide film or a metal-based nitride film containing a metal element such as titanium (Ti), zirconium (Zr), hafnium (Hf), tantalum (Ta), niobium (Nb), aluminum (Al), molybdenum (Mo), tungsten (W), or the like, on the wafer 200. That is, the present disclosure may be suitably applied to a case of forming a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, a HfO film, a HfOC film, a HfOCN film, a HfON film, a HfN film, a HfSiN film, a HfBN film, a HfBCN film, a TaO film, a TaOC film, a TaOCN film, a TaON film, a TaN film, a TaSiN film, a TaBN film, a TaBCN film, a NbO film, a NbOC film, a NbOCN film, a NbON film, a NbN film, a NbSiN film, a NbBN film, a NbBCN film, an AlO film, an AlOC film, an AlOCN film, an AlON film, an AN film, an AlSiN film, an AlBN film, an AlBCN film, a MoO film, a MoOC film, a MoOCN film, a MoON film, a MoN film, a MoSiN film, a MoBN film, a MoBCN film, a WO film, a WOC film, a WOCN film, a WON film, a WN film, a WSiN film, a WBN film, a WBCN film, or the like, on the wafer 200.

In such cases, as the precursor gas, it may be possible to use, for example, a tetrakis(dimethylamino)titanium ($Ti[N(CH_3)_2]_4$, abbreviation: TDMAT) gas, a tetrakis(ethylmethylamino)hafnium ($Hf[N(C_2H_5)(CH_3)]_4$, abbreviation: TEMAH) gas, a tetrakis(ethylmethylamino)zirconium ($Zr[N(C_2H_5)(CH_3)]_4$, abbreviation: TEMAZ) gas, a trimethylaluminum ($Al(CH_3)_3$, abbreviation: TMA) gas, a titaniumtetrachloride ($TiCl_4$) gas, a hafniumtetrachloride ($HfCl_4$) gas, or the like.

That is, the present disclosure may be suitably applied to a case of forming a semimetal-based film containing a semimetal element or a metal-based film containing a metal element. Processing procedures and process conditions of these film-forming processes may be the same as those of the film-forming processes described in the above-described embodiments and modifications. Even in these cases, the same effects as in the above-described embodiments and modifications may be obtained.

Recipes used in the film-forming process may be provided individually according to the processing contents and may be stored in the memory 121*c* via a telecommunication line or the external memory 123. Then, when starting various types of processes, the CPU 121*a* may properly select an appropriate recipe from the recipes stored in the memory 121*c* according to the processing contents. Thus, it is possible to form thin films of various film types, composition ratios, film qualities, and film thicknesses with a single substrate processing apparatus in a versatile and well-reproducible manner. Further, it is possible to reduce an operator's burden and to quickly start the various types of processes while avoiding an operation error.

The above-mentioned recipes are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. Further, the existing recipes already installed in the substrate processing apparatus may be directly modified by operating the input/output apparatus 122 of the substrate processing apparatus.

According to the present disclosure in some embodiments of the present disclosure, it is possible to provide a technique capable of improving the uniformity of substrate processing.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a process chamber in which a substrate is processed;

a plurality of first electrodes;

a plurality of second electrodes;

a high-frequency power supply configured to supply a high-frequency power;

a high-frequency power application plate configured to connect the plurality of first electrodes to the high-frequency power supply;

a grounding plate configured to ground the plurality of second electrodes; and a pedestal configured to fix the high-frequency power application plate and the grounding plate.

2. The substrate processing apparatus of claim 1, wherein the high-frequency power application plate is connected to the high-frequency power supply at a central position of the high-frequency power application plate.

3. The substrate processing apparatus of claim 1, wherein the grounding plate is grounded at a central position of the grounding plate.

4. The substrate processing apparatus of claim 1, further comprising a substrate holder configured to hold the substrate such that the substrate is loaded into the process chamber, wherein the plurality of first electrodes and the plurality of second electrodes are disposed in a stack direction of the substrate held by the substrate holder.

5. The substrate processing apparatus of claim 4, wherein the high-frequency power application plate is provided at lower sides of the plurality of first electrodes.

6. The substrate processing apparatus of claim 5, wherein the grounding plate is provided at lower sides of the plurality of second electrodes.

7. The substrate processing apparatus of claim 1, wherein the plurality of first electrodes and the plurality of second electrodes are provided outside the process chamber.

8. The substrate processing apparatus of claim 7, further comprising a cover configured to fix the plurality of first electrodes and the plurality of second electrodes.

9. The substrate processing apparatus of claim 8, further comprising a ring-shaped fixture configured to fix an upper side of the process chamber and an upper side of the cover.

10. The substrate processing apparatus of claim 1, wherein a plurality of electrode units, each of which is constituted by the plurality of first electrodes and the plurality of second electrodes, are provided.

11. The substrate processing apparatus of claim 1, further comprising a heater outside the process chamber.

12. The substrate processing apparatus of claim 11, wherein the plurality of first electrodes and the plurality of second electrodes are provided between the process chamber and the heater.

13. The substrate processing apparatus of claim 1, wherein the plurality of first electrodes and the plurality of second electrodes are alternately disposed.

14. The substrate processing apparatus of claim 1, wherein a width of each of the first electrodes is the same as a width of each of the second electrodes.

15. The substrate processing apparatus of claim 1, wherein a width of each of the first electrodes is different from a width of each of the second electrodes.

16. The substrate processing apparatus of claim 15, wherein the width of each of the first electrodes is larger than the width of each of the second electrodes.

17. The substrate processing apparatus of claim 1, wherein the number of first electrodes is equal to the number of second electrodes.

18. A plasma generating apparatus comprising:

a plurality of first electrodes;

a plurality of second electrodes;

a high-frequency power application plate configured to connect the plurality of first electrodes to a high-frequency power supply;

a grounding plate configured to ground the plurality of second electrodes; and a pedestal configured to fix the high-frequency power application plate and the grounding plate.

19. A method of manufacturing a semiconductor device, comprising:

loading a substrate into a process chamber of a substrate processing apparatus in which the substrate is processed; and processing the substrate, wherein the substrate processing apparatus includes the process chamber, a plurality of first electrodes, a plurality of second electrodes, a high-frequency power supply configured to supply a high-frequency power, a high-frequency power application plate configured to connect the plurality of first electrodes to the high-frequency power supply, a grounding plate configured to ground the plurality of second electrodes, and a pedestal configured to fix the high-frequency power application plate and the grounding plate.

* * * * *